United States Patent [19]
Komori et al.

[11] Patent Number: 5,457,339
[45] Date of Patent: Oct. 10, 1995

[54] SEMICONDUCTOR DEVICE FOR ELEMENT ISOLATION AND MANUFACTURING METHOD THEREOF

[75] Inventors: Shigeki Komori; Katsuhiro Tsukamoto, both of Hyogo, Japan

[73] Assignee: Mitsubishi Denki Kabushiki Kaisha, Tokyo, Japan

[21] Appl. No.: 252,629

[22] Filed: Jun. 2, 1994

Related U.S. Application Data

[63] Continuation of Ser. No. 2,836, Jan. 14, 1993, abandoned.

[30] Foreign Application Priority Data

Jan. 17, 1992 [JP] Japan ................................ 4-006567
Dec. 7, 1992 [JP] Japan ................................ 4-326457

[51] Int. Cl.[6] .................................................. H01L 27/04
[52] U.S. Cl. ........................ 257/510; 257/513; 257/520; 437/67
[58] Field of Search ........................ 257/510, 513, 257/514, 515, 518, 519, 520, 301, 305, 511, 512, 516, 517; 437/67, 68

[56] References Cited

U.S. PATENT DOCUMENTS

| | | | |
|---|---|---|---|
| 4,309,716 | 1/1982 | El-Kareh | 257/513 |
| 4,473,598 | 9/1984 | Epharth et al. | 257/520 |
| 4,520,552 | 6/1985 | Arnould et al. | |
| 4,556,585 | 12/1985 | Abernathy et al. | 257/510 |
| 4,729,964 | 3/1988 | Natsuaki et al. | |
| 4,884,117 | 11/1989 | Neppl et al. | 257/518 |
| 4,980,747 | 12/1990 | Hutter et al. | |
| 5,250,837 | 10/1993 | Sparks | 257/520 |

FOREIGN PATENT DOCUMENTS

| | | |
|---|---|---|
| 4143209A1 | 7/1993 | Germany. |
| 63-151070 | 6/1988 | Japan. |
| 63-170937 | 7/1988 | Japan. |
| 64-31434 | 2/1989 | Japan. |
| 1-319969 | 12/1989 | Japan. |

OTHER PUBLICATIONS

A. S. Grove, *Physics and Technology of Semiconductor Devices*, John Wiley & Sons, New York (1967) pp. 78–83.
C. G. Jambotkar, "Improved Polysilicon–Filled Trench Isolation" U.S. Mag.: IBM Technical Disclosure Bulletin, vol. 27, No. 3, Aug. 1984, pp. 1481 to 1482.
B. El-Kareh et al., "Field-Shielded Trench Fill", U.S. Mag.: IBM Technical Disclosure Bulletin, vol. 27, No. 8, Jan. 1985, pp. 4851–4854.
S. D. Malaviya, "Deep Trench Isolation for Bipolar Processes", U.S. Mag.: IBM Technical Disclosure Bulletin, vol. 24, No. 11A, Apr. 1982, pp. 5578 to 5580.
K. D. Beyer et al., "Borosilicate Glass Trench Fill", U.S. Mag.: IBM Technical Disclosure Bulletin, vol. 27, No. 2, Jul. 1984, pp. 1245 to 1247.

*Primary Examiner*—J. Carroll
*Attorney, Agent, or Firm*—Lowe, Price, LeBlanc & Becker

[57] ABSTRACT

A semiconductor device for element isolation comprises a semiconductor substrate having an impurity region of a first conductivity type whose impurity concentration attains the maximum at a predetermined depth from the surface in the depth direction, a trench formed to a predetermined depth in the impurity region of the first conductivity type, and an impurity diffusion region of the first conductivity type formed in the trench with an oxide film interposed and having only its bottom portion connected to the impurity region of the first conductivity type of the semiconductor substrate. In the semiconductor device, a uniform $P^+$ high concentration region is substantially formed in a bottom portion of an isolation region, so that an isolation threshold value is not affected.

19 Claims, 46 Drawing Sheets

LOCOS STRUCTURE

CONVENTIONAL STRUCTURE

PRESENT EMBODIMENT

LOCOS STRUCTURE

CONVENTIONAL STRUCTURE

PRESENT EMBODIMENT

© 1

SEMICONDUCTOR DEVICE FOR ELEMENT ISOLATION AND MANUFACTURING METHOD THEREOF

This application is a continuation of application Ser. No. 08/002,836 filed Jan. 14, 1993 abandoned.

BACKGROUND OF THE INVENTION

1. Field of the Invention

The present invention relates to a semiconductor device for element isolation and to manufacturing method thereof. More particularly, the present invention relates to a semiconductor device for element isolation and manufacturing method thereof which allows fine element isolation.

2. Description of the Background Art

In recent semiconductor devices, miniaturized or fine isolation of elements have been desired, as higher integration of elements is in greater demand. The LOCOS (Local Oxidation of Silicon) method has been widely used as a method for element isolation. However, in element isolation by LOCOS method, bird's beaks are formed, which prevents provision of small width of isolation.

Consequently, a so called trench isolation technique using a narrow and deep trench has come to attract attention as a method of element isolating allowing fine element isolation. One example of the trench isolation technique is disclosed in Japanese Patent Laying Open-No. 63-170937.The element isolating structure disclosed in this Article will be described with reference to FIG. 70.

In the structure for isolation of a semiconductor device, a trench 31 is formed from a surface of p type semiconductor substrate 30 to a depth of about 1–2 μm. A side surface of trench 31 is covered with an oxide film 34, and a P$^+$ type semiconductor layer 35 of a concentration of $10^{20}$–$10^{22}$ cm$^3$ is formed with oxide film 34 interposed. In P type semiconductor substrate 30 contacting a bottom surface of trench 31, P$^+$ type diffusion layer 36 of a concentration of $10^{20}$–$10^{22}$ cm$^3$ for preventing formation of an inversion layer in the surface of p type semiconductor substrate 30 is formed and serves as a channel stopper. P$^+$ type diffusion layer 36 also serves to prevent a punch through phenomenon. On an upper surface of P$^+$ type semiconductor layer 35, an oxide film 38 is formed in a thickness of about 1000–2000Å. A gate oxide film 39 is formed on a surface of P type semiconductor substrate 30 except an area where oxide film 38 is formed.

A structure of a MOS transistor to which the structure for isolation is applied will be described hereinafter.

A gate electrode 40 is formed on gate oxide film 39 of the structure for isolation described above. Source/drain regions 41 of N$^+$ type impurity region are formed to a predetermined depth on both sides of gate electrode 40.

Gate electrode 40 is covered with interlayer insulating film 42. A metallic interconnection 43 electrically connected to gate electrode 40 is formed to extend beneath interlayer insulating layer 42 above trench 31.

A manufacturing method of the structure for isolation will be described hereinbelow with reference to FIGS. 71 through 75.

Referring to FIG. 71, a thin thermal oxide film 32 having a thickness of about 300Å is formed on P type semiconductor substrate 30. A nitride film 33 is grown by a CVD method, and regions of nitride film 33, oxide film 32 and semiconductor substrate 30 which are to be regions for isolation are etched to a depth of about 1–2 μm to form trench 31.

Referring to FIG. 72, after a thermal oxide film 34 is formed relatively thick on a sidewall portion of trench 31, thermal oxide film 34 in the bottom portion of trench 31 is etched away by anisotropic etching to expose semiconductor substrate 30. Since a transistor forming region is covered with nitride film 33 which serves as a mask, etching of the region is prevented. Thereafter, a polycrystalline silicon 35 is grown to about 1–2 μm on the entire surface of the substrate including trench 31.

Referring to FIG. 73, impurities of a p type conductivity which is the same as that of the substrate are introduced into polycrystalline silicon 35 at a high concentration by an ion implantation or a gas phase doping, and diffused so deeply as to reach semiconductor substrate 30 contacting polycrystalline silicon 35 at the bottom surface portion of trench 31 in heat treatment. P$^+$ type diffusion layer 36 is then formed as a channel stopper in semiconductor substrate 30 under the bottom portion of trench 31. Since the transistor forming region is covered with nitride film 33, impurities are not diffused into the region. Also, the side surface of trench 31 is covered with thermal oxide film 34, and therefore impurities are not diffused thereto. A photoresist film 37 is formed to flatten the surface of polycrystalline silicon 35.

Photoresist film 37 and polycrystalline silicon 35 having diffused impurities are etched back by anisotropic etching until the surface of nitride film 33 is exposed. As shown in FIG. 74, a structure in which polycrystalline silicon 35 fills trench 31 is thus finished. Thereafter, semiconductor substrate 30 is thermally oxidized and a relatively thin oxide film 38 is formed in a thickness of about 1000Å–2000Å on a surface of polycrystalline silicon 35 embedded in trench 31. Nitride film 33 and thermal oxide film 32 are removed, and a gate oxide film 39 is formed (FIG. 75). The structure for isolation is thus finished.

After the structure for isolation shown in FIG. 75 is formed, gate electrode 40 is patterned to a predetermined shape and source/drain regions 41 are formed. Interlayer insulating film 42 is grown, a contact hole is opened at a predetermined position and metallic interconnection 43 is provided. AMOS transistor as shown in FIG. 70 is then finished.

A manufacturing method of a CMOS transistor having the structure for isolation of a semiconductor device will be described hereinbelow with reference to FIGS. 76 through 87.

Referring to FIG. 76, after a right half surface of a p type semiconductor substrate 51 is covered with a resist film 52, phosphorus (P) is implanted to a predetermined depth in a left half region of p type semiconductor substrate 51 under conditions of 500 KeV–1.5 MeV and $1\times 10^{12}$–$1\times 10^{15}$ cm$^{-2}$. Heat treatment is carried out for 20 minutes to 10 hours at temperature of 800°–1200° C. to form an n type impurity diffusion region 53.

Referring to FIG. 77, after resist film 52 is removed, a surface of n$^+$ impurity diffusion region 53 of p type semiconductor substrate 51 is covered with a resist film 54. Boron (B) is implanted into a right half region of p type semiconductor substrate 51 under conditions of 200 KeV–1 MeV and $1\times 10^{12}$–$1\times 10^{15}$ cm$^{-2}$. Heat treatment is carried out for 20 minutes–10 hours at temperature of 800°– 1200° C. to form a p type impurity diffusion region 55.

Referring to FIG. 78, after resist film 54 is removed, a thin thermal oxide film 56 of a thickness of about 300Å is formed on surfaces of n type impurity diffusion region 53 and p type impurity diffusion region 55 and a nitride film 57 is grown on oxide film 56 using the CVD method. Thereafter, a resist film 58 is formed on nitride film 57 and is patterned. Using resist film 58 as a mask, regions of nitride film 57, oxide film 56, n type impurity diffusion region 53 and p type impurity diffusion region 55 which are to be an isolation region are etched to a depth of about 1–2 μm, so that trenches 59, 60 are formed as shown in FIG. 79.

Referring to FIG. 80, after resist film 58 is removed, thermal oxide films 61, 62 are formed relatively thick in trenches 59, 60. Thermal oxide films 61, 62 on bottom surfaces of trenches 59, 60 are removed by anisotropic etching to expose semiconductor substrate 51. At this time, n type impurity diffusion region 53 and p type impurity diffusion region 55 are not etched, since they are covered with nitride film 57 which serves as a mask. Thereafter, referring to FIG. 81, a polycrystalline silicon 70 is grown to about 1–2 μm on the entire surface of semiconductor substrate 51 including trenches 59, 60.

Referring to FIG. 82, a surface of polycrystalline silicon 70 above p type impurity diffusion region 55 is again covered with resist film 63, and phosphorus (P) is implanted into polycrystalline silicon 70 above n type impurity diffusion region 53 under conditions of 100 KeV and $1\times10^{12}$–$1\times10^{16}$ cm$^{-2}$.

After resist film 63 is removed, referring to FIG. 83, a resist film 64 is formed on n$^+$ type impurity diffusion region 70a of a high concentration. Boron (B) is implanted into polycrystalline silicon 70 above p type impurity diffusion region 55 under conditions of 50 KeV and $1\times10^{12}$–$1\times10^{16}$ cm$^{-2}$ in the same manner as is described above.

After resist film 64 is removed, referring to FIG. 84, photoresist film 65 is provided on surfaces of p$^+$ type impurity diffusion region 70a and n$^+$ type impurity diffusion region 70b to flatten these surfaces. Referring to FIG. 85, photoresist film 65, n$^+$ type impurity diffusion region 70a and p$^+$ type impurity diffusion region 70b are etched back, and nitride film 57 is exposed. Heat treatment is carried out under conditions of temperature of 800° C.–1200° C. and a time of 20 minutes–10 hours. Impurities in n type impurity diffusion region 70a and p$^+$ type impurity diffusion region 70b are diffused from bottom portions of trenches 59, 60, respectively to substrate 51. As a result, a structure is formed, in which n$^+$ type impurity diffusion region 70a and p$^+$ type impurity diffusion region 70b are embedded in trenches 59 and 60, respectively, and n diffusion layer 53a and p$^+$ diffusion layer 55a serving as channel stoppers exist in the bottom portions of these trenches.

Referring to FIG. 86, a semiconductor substrate 51 is thermally oxidized, and relatively thin oxide films 66, 67 (about 1000–2000Å) are formed on the surfaces of n$^+$ type impurity diffusion region 70a and p$^+$ type impurity diffusion region 70b embedded in trenches 59, 60. Thereafter, nitride film 57 and thermal oxide film 56 are removed and a gate oxide film 68 is formed.

A structure for isolation used for a CMOS is thus finished.

Thereafter a gate oxide film 80 is deposited and a gate electrode 81 is formed. Gate electrode 81 is etched to have a predetermined shape using photolithography. Source/drain regions 82, 83 are each formed in the substrate. An interlayer oxide film 84 is deposited on the entire surface of the substrate. Contact holes 85 reaching source/drain regions 82, 83 are opened using photolithography. Aluminum 86 is deposited by sputtering and aluminum 86 is etched using photolithography. A CMOS transistor as shown in FIG. 87 is thus finished.

However, the structure of the semiconductor for element isolation described above has the following problem.

First, referring to FIG. 88, a first problem will be described. The p$^+$ semiconductor layer 35 has high impurity concentration in the range of $1\times10^{20}$ to $1\times10^{22}$ cm$^3$. Therefore, when a gate electrode is formed on the oxide film 38 as shown in the figure, a capacitor C$_1$ having a large parasitic capacitance is formed by the gate electrode 40, the oxide film 38 and the p$^+$ semiconductor layer 35.

The existence of the capacitor C1 represented in an equivalent circuit is as shown in FIG. 89. As the capacitor C$_1$ exists, electrons are charged/discharged to and from the capacitor C$_1$ on the output side (OUT) of the circuit, which causes delay in signals. Therefore, as shown in the graph of FIG. 90, the speed of the device becomes slower.

When the impurity concentration of the semiconductor layer 35 is decreased to solve the above described problem, the semiconductor layer 35 comes to have a nature near an insulator. Therefore, as shown in FIG. 91, the electric field E from the gate electrode 4 inverts the sidewalls of the trench 31 directly, causing degradation of isolation.

Secondly, as shown in FIG. 92, in heat treatment necessary to form a channel stopper region in a bottom portion of a trench, since the impurity concentration is as high as $10^{20}$–$10^{22}$ cm$^3$, impurities are widely diffused into a substrate to raise an impurity concentration in the vicinity of a surface of the substrate, so that a threshold voltage is increased. As shown in FIGS. 93(a), 93(b), when an isolation width is small, impurity diffusion regions from both isolation regions overlap each other and the concentration is liable to rise. This phenomenon appears more remarkably in a narrow channel. Since atomic radii of silicon and boron are different, defects are liable to be caused in the substrate, resulting in generation of leakage current.

Thirdly, when the above described structure of a semiconductor device is used for a CMOS structure, the number of manufacturing steps is extremely large and reliability must be secured in every step. Therefore, improvement of reliability of products, reduction of the cost and increase of a yield are hindered.

SUMMARY OF THE INVENTION

An object of the present invention is to provide a semiconductor device for element isolation having a structure for isolation in a form of a trench without a need of a channel stopper region.

Another object of the present invention is to provide a manufacturing method of a semiconductor device for element isolation in which impurities are implanted and diffused into a substrate such that a band of maximum impurity concentration is positioned at a predetermined depth in the substrate.

A still further object of the present invention is to provide a semiconductor device for element isolation superior in element isolation and having highly reliable element isolating structure and to provide a manufacturing method thereof.

In order to attain the above described objects, in the semiconductor device for element isolation according to one aspect of the present invention, the semiconductor substrate has a main surface. The semiconductor substrate has a band of maximum impurity concentration of impurities of a first conductivity type at a prescribed depth from and approximately parallel to the main surface. The semiconductor substrate has lower impurity concentration between the main surface and the band of the maximum impurity concentration. A trench for isolation has a sidewall extending from the main surface to the band of the maximum impurity concentration, which trench for isolation is filled with an isolating material.

In this semiconductor device for element isolation, a uniform $p^+$ high concentration region is substantially formed in the bottom portion of the isolation region, so that an isolation threshold value is not affected. Also, as to isolation breakdown voltage and anti-punch through property, a depletion layer from source/drain regions do not join because of the existence of the uniform $p^+$ high concentration region, and therefore a punch through phenomenon can be effectively suppressed.

A semiconductor device for element isolation, according to another aspect of the present invention, for achieving the above-stated objects includes a semiconductor substrate having a first conductivity type impurity region whose impurity concentration attains the maximum at a predetermined depth from a surface in the depth direction; a trench formed from the surface of the semiconductor substrate to a predetermined depth in the impurity region of the first conductivity type; an impurity diffusion region of the first conductivity type provided in the trench with a space from the sidewall, having only its bottom portion in contact with the above-mentioned impurity region of the first conductivity type in the semiconductor substrate and having almost the same impurity concentration as the aforementioned impurity region of the first conductivity type; an oxide film covering an upper surface of the impurity diffusion region and the surface of the semiconductor substrate as well as filling the space between the internal sidewall of the trench and the impurity diffusion region.

According to the semiconductor device for element isolation, at first oxide films are provided on the sidewall portions of the trench as the isolating material provided in the trench. A semiconductor layer is provided inside the oxide films provided on the sidewalls of the trench. Thus the difference in the coefficient of thermal expansion of the isolating material and of the semiconductor substrate can be released. This prevents generation of cracks into the isolating materials, and hence generation of leak current can be avoided. Further, since a high impurity region of $p^+$ is substantially formed approximately uniform at the bottom portion of the isolating region, the isolation threshold value is not affected. In addition, depletion layer from the source/drain regions do no extend because of the high impurity region of $p^+$ uniformly with respect to the isolation breakdown voltage, that is, punch through immunity, and accordingly generation of punch through can be effectively suppressed.

In order to attain the above described aspect, according to one aspect of the method of manufacturing a semiconductor device for element isolation of the present invention, a trench is formed from a the main surface to a prescribed depth of a semiconductor substrate. An isolating material is provided in the trench. Impurities are introduced to the semiconductor substrate such that a band of a maximum impurity concentration exists approximately parallel to the main surface and at a prescribed depth from the main surface. Lower impurity concentration exists between the band of the maximum impurity concentration and the main surface, and the depth of the trench extends to the band of the maximum impurity concentration.

A manufacturing method of a semiconductor device for element isolation, according to another aspect of the present invention, for achieving the above-stated objects includes the steps of forming a trench having a predetermined depth in a semiconductor substrate; forming an oxide film on an internal surface except a bottom surface of the trench; depositing a semiconductor layer in the trench; implanting and diffusing impurities of a first conductivity type into the semiconductor substrate and the semiconductor layer such that impurity concentration attains the maximum at a depth of the bottom of the trench in the depth direction.

According to the manufacturing method, the number of impurity implantation steps can be decreased, whereby the number of steps of forming resist films is also decreased. Thus, a manufacturing process of a semiconductor device can be shortened.

Further, according to a still further aspect, the semiconductor device for element isolation of the present invention includes, in order to attain the above described objects, a semiconductor substrate having a main surface, a trench formed to a prescribed depth from the main surface, a pair of sidewall insulating films provided on the sidewalls of the trench, a buried layer having a prescribed impurity concentration buried in the trench surrounded by the pair of sidewall insulating films, an upper insulating film formed to cover the opening portion of the trench at the main surface, and a pair of conductive layers having higher impurity concentration than the buried layer formed at the side portions of the buried layer and in contact with the lower surface of the upper insulating film and in contact with inner surface of each of the sidewall insulating films.

In order to attain the above described objects, according to a still further aspect, the method of manufacturing a semiconductor device for element isolation of the present invention includes the following steps.

First, a trench having a prescribed depth is formed at the semiconductor substrate. Then, sidewall insulating films are formed on the sidewalls of the trench.

Then, a conductive layer having a prescribed impurity concentration is formed in contact with the inner walls of the sidewall insulating films, from the main surface of the semiconductor substrate to a prescribed depth in the trench. Thereafter, a buried layer having impurity concentration lower than the conductive layer is formed in the trench surrounded by the conductive layer and by the sidewall insulating films.

Thereafter, an upper insulating film having a prescribed thickness covering the opening portion of the trench is formed at the surface of the buried layer.

In accordance with the semiconductor device for element isolation and manufacturing method thereof of the present invention, a pair of conductive layers in contact with inner surfaces of the sidewall insulating films and in contact with the lower surface of the upper insulating film, provided near the side portions of the buried layer and having higher impurity concentration than the buried layer are provided. Consequently, impurity concentration of the buried layer as a whole can be set lower, which suppresses increase of parasitic capacitance. Since the conductive layer for the electric field from the gate electrode is provided, formation of inverted layer at the sidewall portions of the trench can be suppressed with the electric field suppressed by the conductive layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device and a manufacturing method according to a first embodiment of the present invention will be described hereinbelow with reference to FIGS. 1 through 18.

Figure 1:
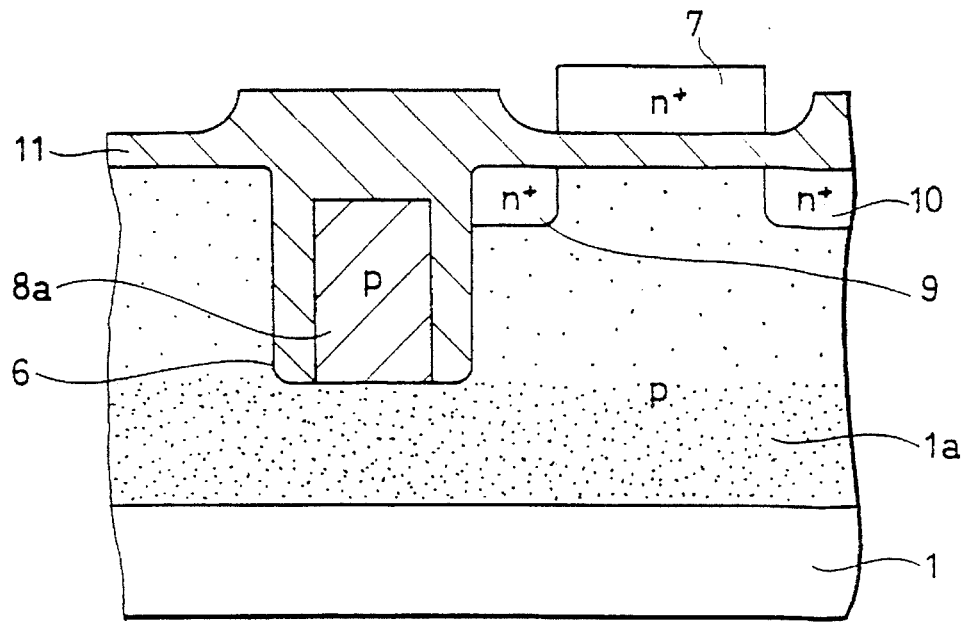
FIG. 1 is a cross section showing a structure of a semiconductor device for element isolation in accordance with a first embodiment of the present invention.

Referring to FIG. 1, a structure of the semiconductor device includes a semiconductor substrate 1 including an impurity region 1a of a first conductivity type, for example, a p type whose impurity concentration attains the maximum at a predetermined depth from the surface, and a trench 6 formed from a surface of p type impurity region 1a of semiconductor substrate 1 to a predetermined depth in p type impurity region 1a. A p type impurity diffusion region 8 is provided with a space from an internal sidewall, having only its bottom surface in contact with semiconductor substrate 1 and having almost the same concentration as impurity region 1a. An oxide film 11 is formed to fill the space between the internal sidewall of trench 6 and p type impurity diffusion region 8 and to cover an upper surface of impurity diffusion region 8 and the surface of semiconductor substrate 1.

Figure 2:
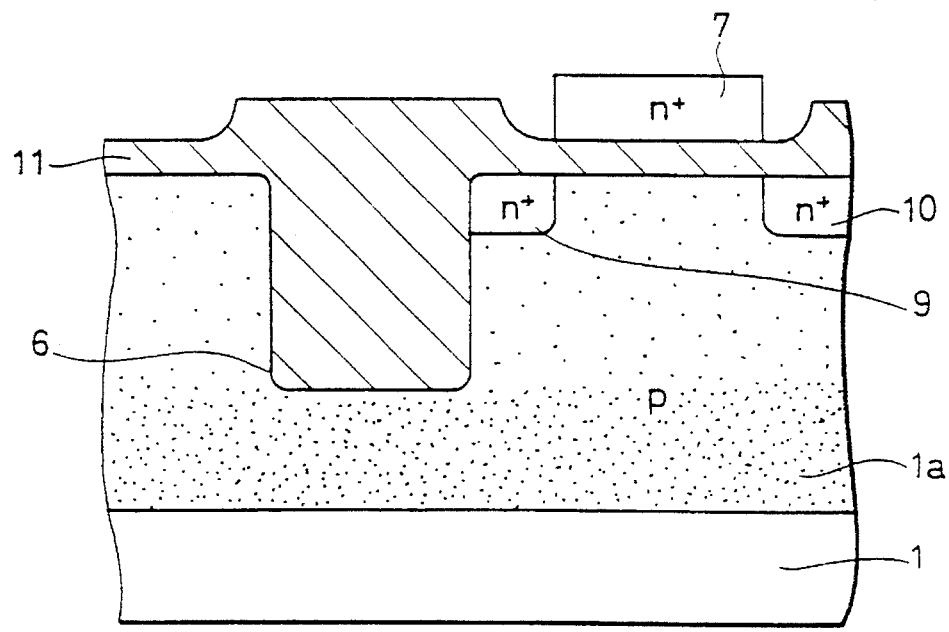
FIG. 2 is a cross sectional view showing another structure of the semiconductor device for element isolation in accordance with the first embodiment of present invention.

Referring to FIG. 2, another structure will be described. In this structure, the inside of the trench 6 is entirely filled by an oxide film. However, in this structure, cracks are generated in the oxide film during the step of thermal processing, since the difference of the coefficient of thermal expansion between the semiconductor substrate 1 and the oxide film 11 is large. If a crack is generated in the oxide film, a leak current is generated in the semiconductor substrate, degrading the capability of element isolation. Therefore, a structure relaxing the difference of the coefficient of thermal expansion by the provision of the semiconductor layer in the trench such as shown in FIG. 1 is preferred. The structure shown in FIG. 1 is described in the following.

In a transistor forming region, a gate electrode 7 is formed on an upper surface of oxide film 11 and source/drain regions 9, 10 of $n^+$ type impurity regions are formed to a predetermined depth in impurity region 1a on both sides of gate electrode 7.

An isolation capability will be described hereinbelow. As to the isolation capability, both "an isolation threshold value" and "an isolation breakdown voltage" should be considered.

Figure 3A:
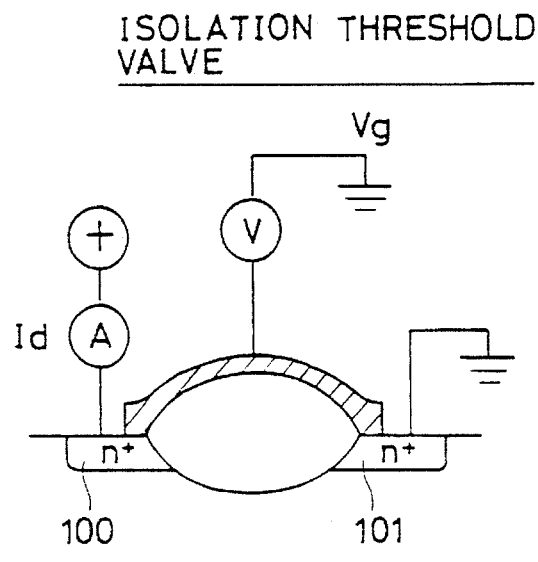
FIG. 3 (a) is a schematic diagram showing the separation threshold value, and FIG. 3 (b) shows relation between voltage and current.
Figure 3B:
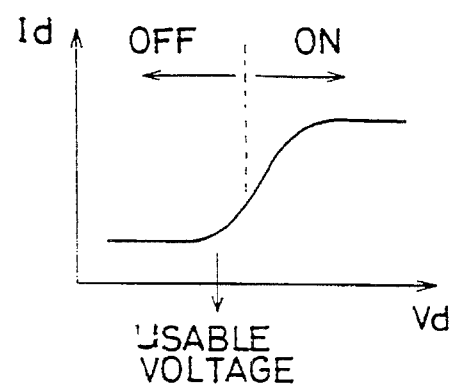

Referring to FIGS. 3 (a), and 3 (b), "an isolation threshold value" means a value of a gate voltage $V_g$ at which left and right source/drain regions 100, 101 are rendered conductive.

Figure 4A:
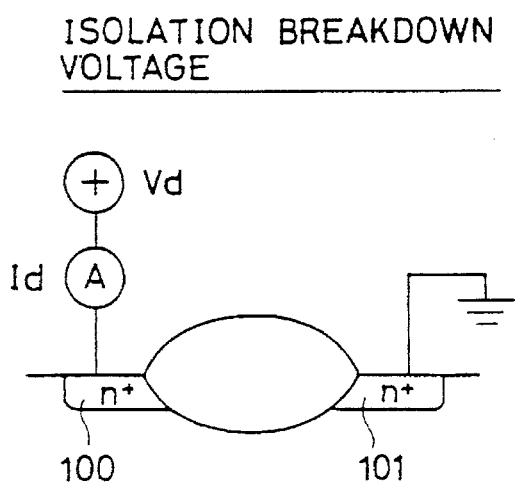
FIG. 4 (a) is a schematic diagram showing separation breakdown voltage, and FIG. 4 (b) shows relation between the voltage and the current.
Figure 4B:
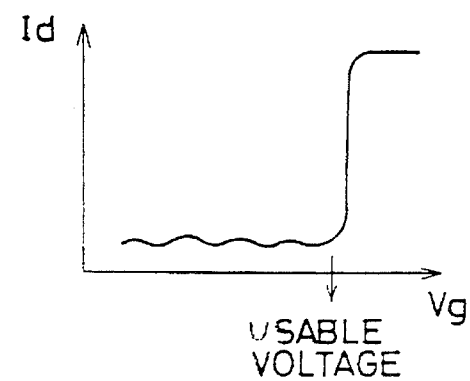

Referring to FIGS. 4 (a), "an isolation breakdown voltage" is a voltage applied to one of source/drain regions 100, 101 when source/drain regions 100, 101 are rendered conductive or a junction breakdown occurs. FIG. 4 (b) shows in the relationship between voltage Vd and current Id.

Isolation threshold values and isolation breakdown voltages of an LOCOS structure, a conventional structure and the structure of the present embodiment are compared for isolation capability.

Figure 5A:
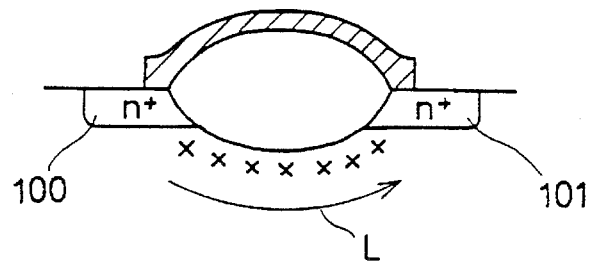
FIG. 5 is a diagram for comparing the separation threshold value in (a) LOCOS structure, (b) conventional structure and (c) the present embodiment.
Figure 5B:
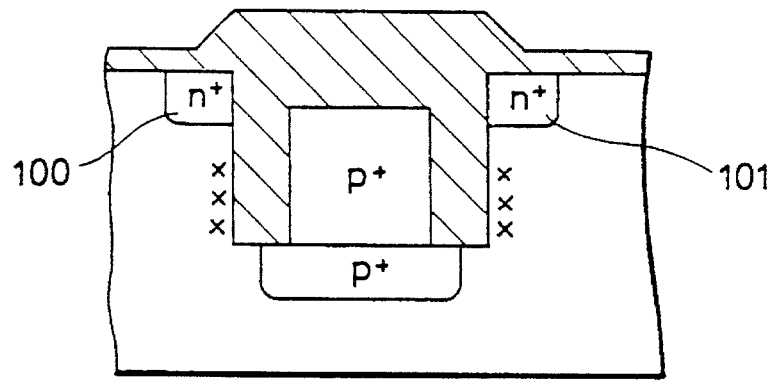
Figure 5C:
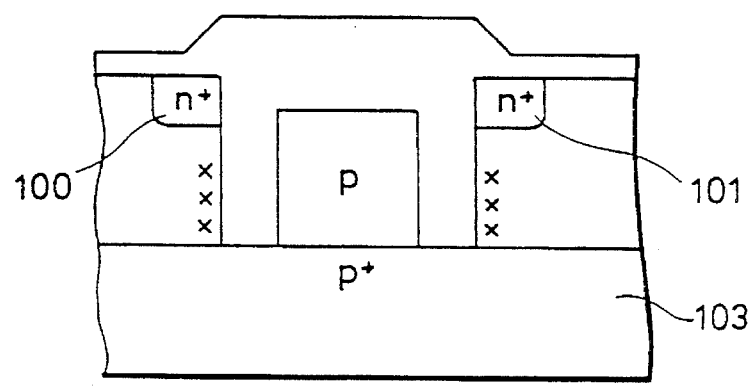

When respective isolation threshold values are compared, referring to FIGS. 5(a), 5(b) and 5(c), in the LOCOS structure, a path L between elements 100, 101 is short, and also there is possibility for inversion in regions marked with X in path L, and therefore, it can be seen that it is easily rendered conductive.

In the conventional structure, a path between elements 100, 101 is long and inversion in regions marked with X in the sidewall portion of the trench does not occur and therefore it is not easily rendered conductive.

In the structure of the present embodiment, a path between elements 100, 101 is long, as in the conventional structure, inversion in regions marked with X in the sidewall portion of the trench does not occur and therefore it is not easily rendered conductive. Also, since p$^+$ layer 103 of a high concentration is provided in the bottom portion of the trench, even if an inversion layer is formed, it is impossible to be rendered conductive and therefore isolation capability can be fully enhanced.

Figure 6A:
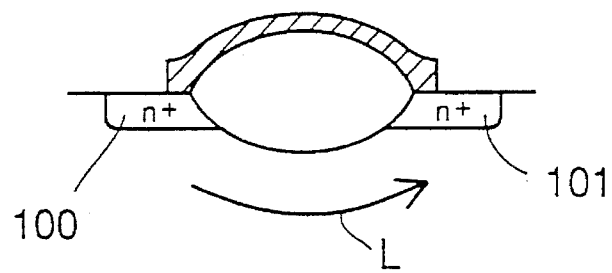
FIG. 6 is a diagram for comparing separation breakdown voltage in (a) LOCOS structure, (b) conventional structure and (c) in the present embodiment.
Figure 6B:
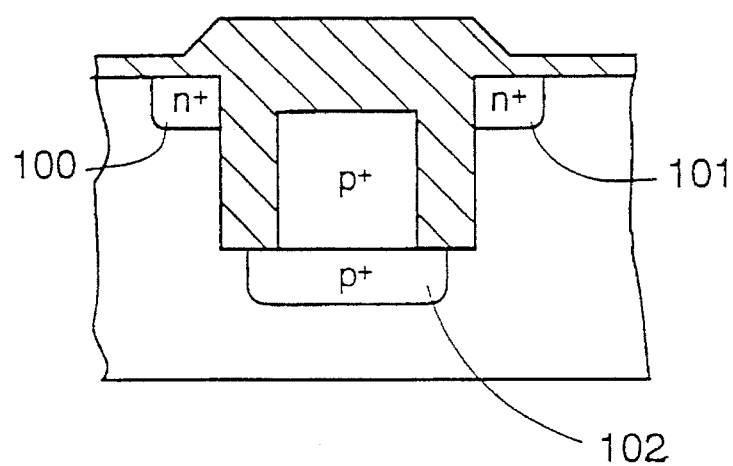
Figure 6C:
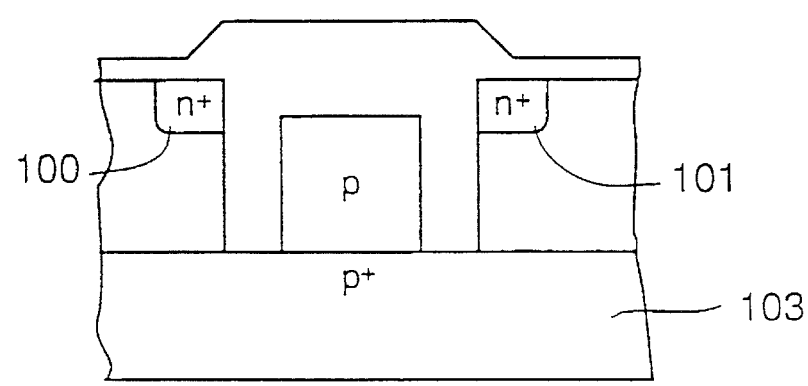

When isolation breakdown voltages are compared, referring to FIGS. 6(a), 6(b) and 6(c), since in the LOCOS structure, path L between element 100, 101 is short as described above, a punch through phenomenon is likely to occur.

In the conventional structure, since there is only one high concentration layer 102, a depletion layer is rendered conductive at a deep portion of the substrate, resulting in possibility of a punch through phenomenon.

However, in the structure of the present embodiment, by selecting impurity implantation energy to attain the maximum impurity concentration in the bottom portion of the trench, p$^+$ layer 103 can be substantially formed in the bottom portion of the substrate. As a result, since depletion layers from the source/drain regions are not joined because of the existence of p$^+$ layer 110, a punch through phenomenon can be effectively suppressed.

By using the above structure in an NMOS transistor, isolation can be achieved without providing a channel stopper region in a bottom portion of an isolation region.

Figure 8:
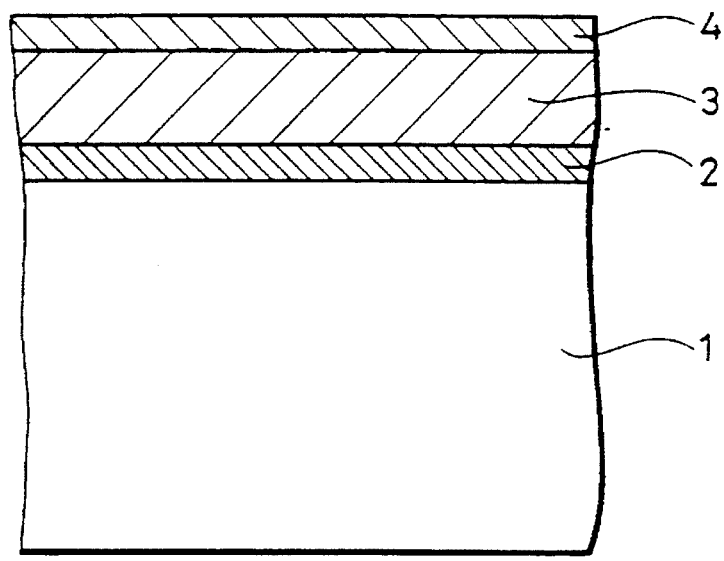
FIGS. 8 to 18 are cross sections showing the first to eleventh steps of manufacturing in accordance with the first embodiment of the present invention.

In a manufacturing method of a semiconductor device having the above structure, referring to FIG. 8, a first oxide film 2 of SiO$_2$ is formed in a thickness of about 300Å on a surface of a semiconductor substrate 1 using a thermal oxidation method. A first semiconductor layer 3 of polysilicon is formed in a thickness of about 500–2000Å on a surface of first oxide film 2 using the CVD method, and thereafter, a second oxide film 4 of SiO$_2$ is formed in a thickness of about 300Å on a surface of first semiconductor layer 3 using a thermal oxidation method.

Figure 9:
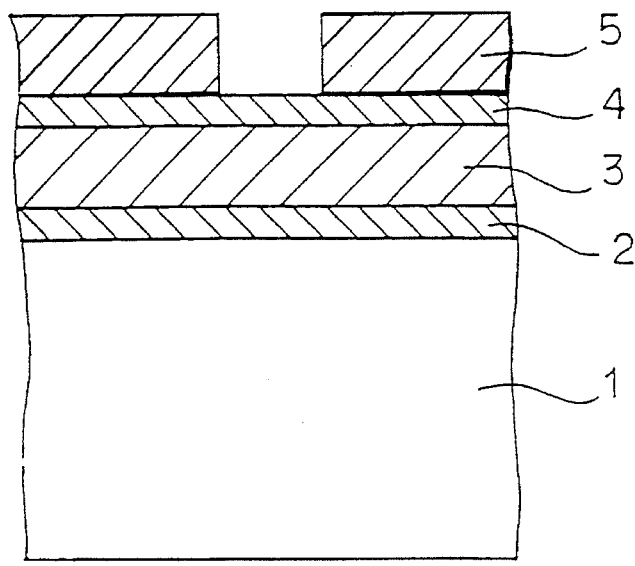

Referring to FIG. 9, a resist film 5 having a predetermined pattern is formed on a surface of second oxide film 4.

Figure 10:
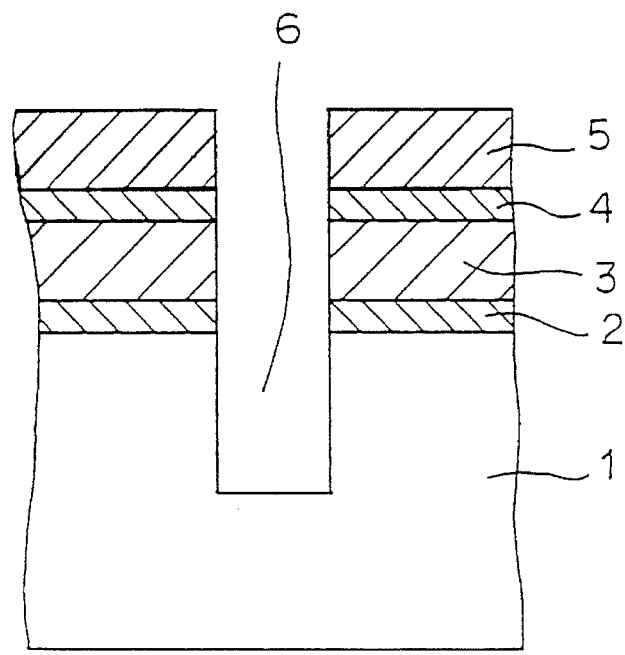

Referring to FIG. 10, a trench 6 having a depth of about 0.3–1.0 μm is formed by anisotropic etching, using resist film 5 as a mask.

Figure 11:
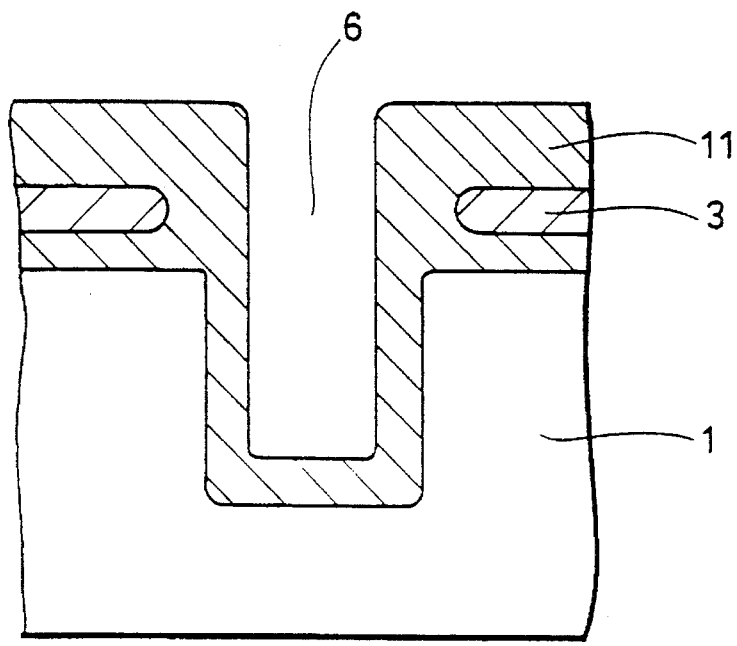

After trench 6 is formed, referring to FIG. 11, resist film 5 is removed and an oxide film is formed in an internal surface of trench 6 by a thermal oxidation method. At this time, first semiconductor layer 3 is further oxidized and second oxide film 4 is thickened. In a side surface portion of trench 6, second oxide film 4 and first oxide film 2 are united. The oxide film thus formed is hereinafter referred to as an oxide film 11 hereinafter.

Figure 12:
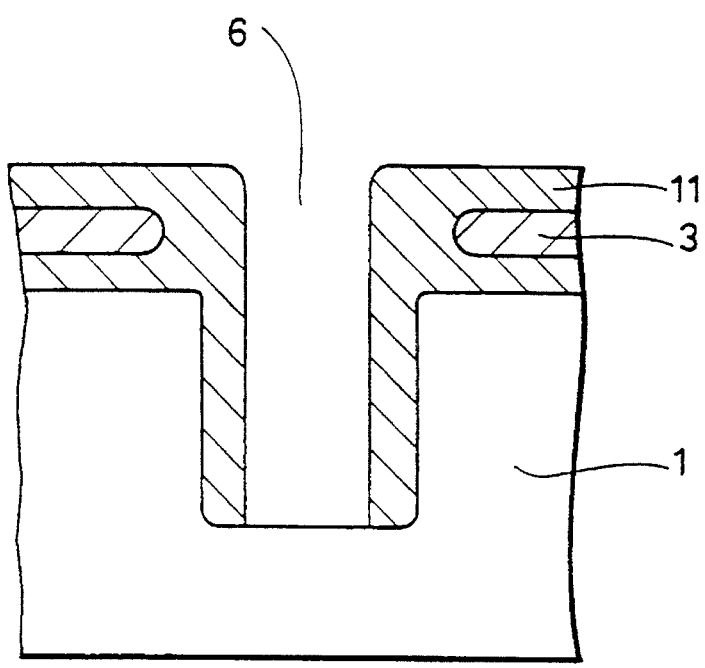
Figure 13:
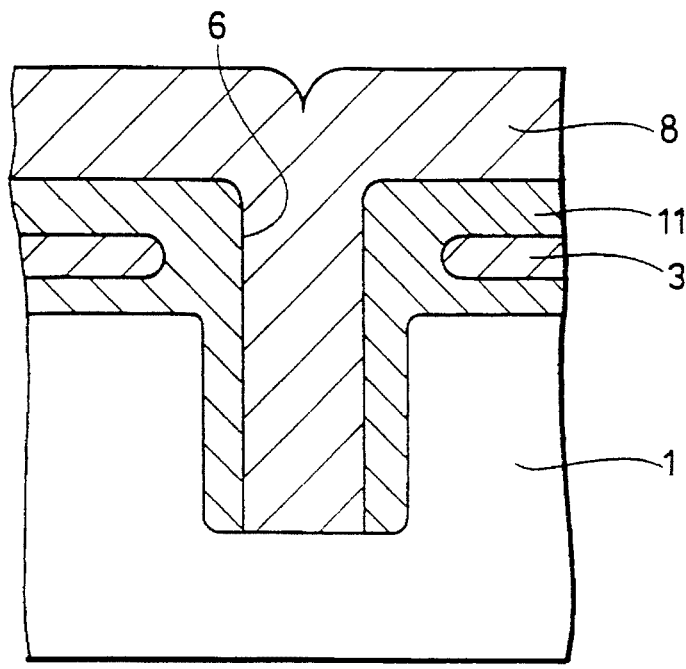

Referring to FIG. 12, oxide film 11 in a bottom surface portion of trench 6 is etched away by anisotropic etching, so that semiconductor substrate 1 is exposed. Referring to FIG. 13, a second semiconductor layer 8 is epitaxially grown at a growth rate of 0.2–1.4 μm/min and at growth temperatures in a range of about 700° C. to 1200° C., using a gas such as SiCl$_4$, SiHCl$_3$, SiH$_2$Cl$_2$, SiH$_4$ in trench 6 and on a surface of oxide film 11.

Figure 7:
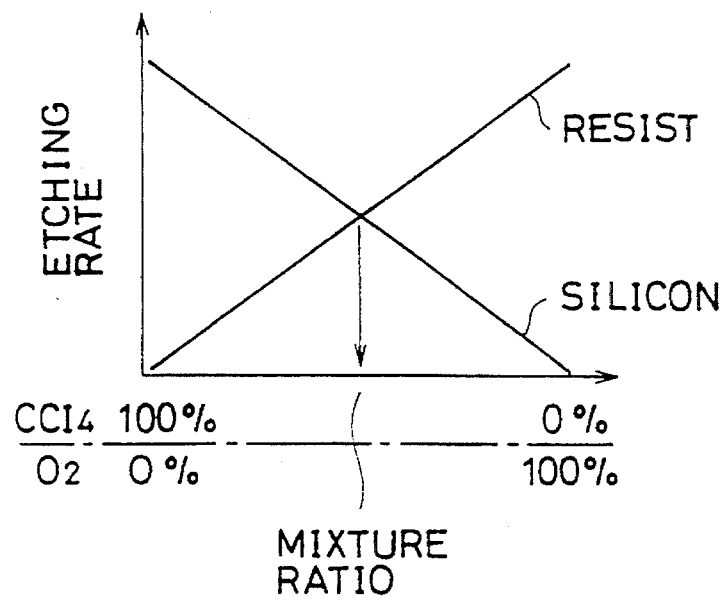
FIG. 7 is a graph for obtaining set mixing ratio for making the each rate of silicon equal to the etch rate of resist.
Figure 14:
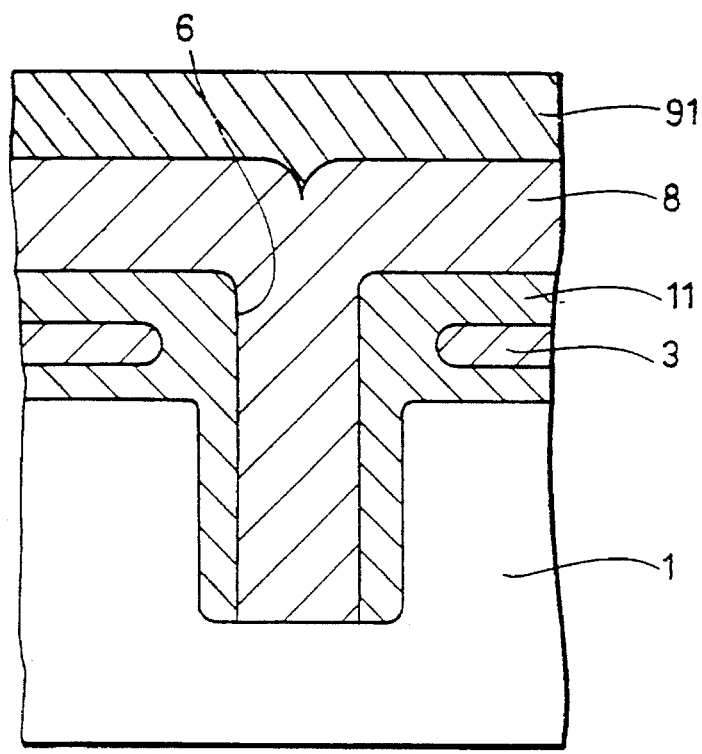
Figure 15:
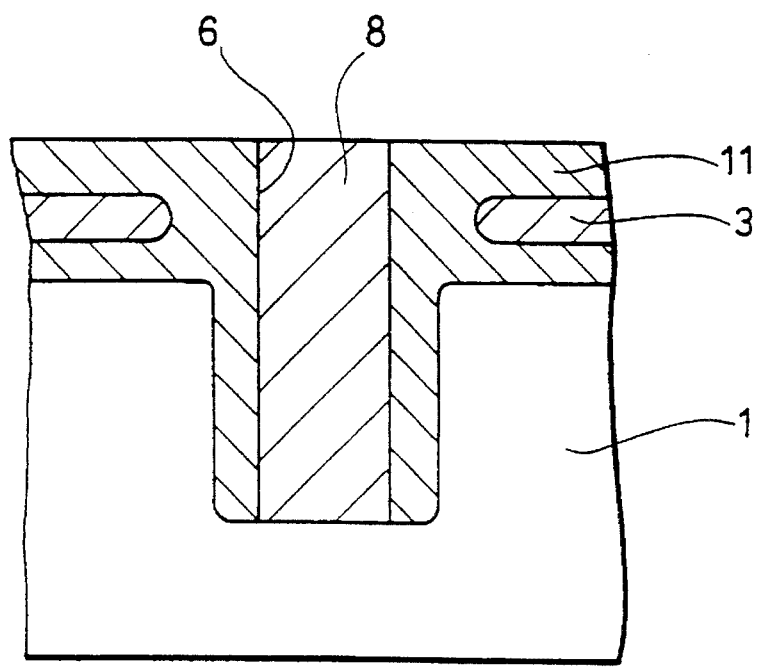

Referring to FIGS. 14 and 15, to flatten a surface of semiconductor layer 8, a resist film 91 is formed flat on the surface of semiconductor layer 8 and etched back to a predetermined depth. In this etching, as shown in FIG. 7, CCl$_4$ and O$_2$ are mixed such that an etch rate for silicon and an etch rate for resist are equal.

Figure 16:
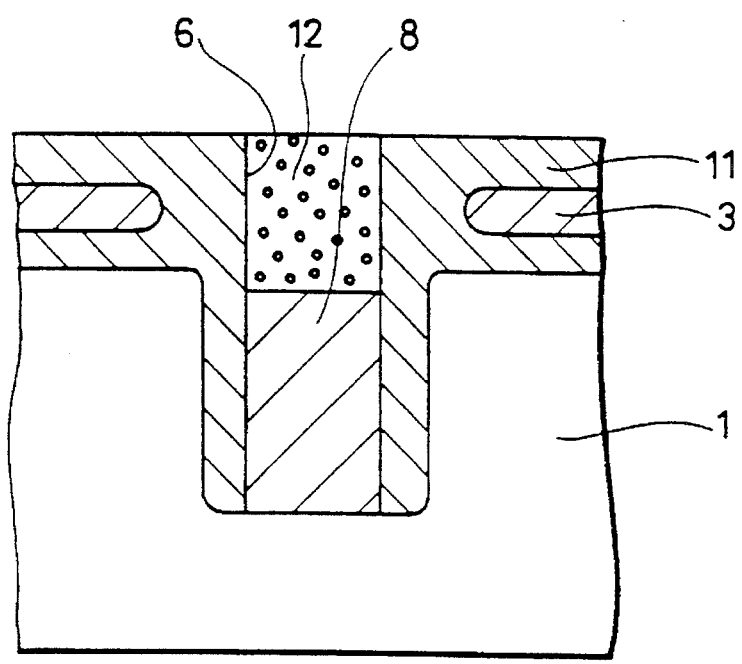

Referring to FIG. 16, semiconductor layer 8 is thermally oxidized more deeply than the surface of semiconductor substrate 1, and oxide film 12 is formed.

Figure 17:
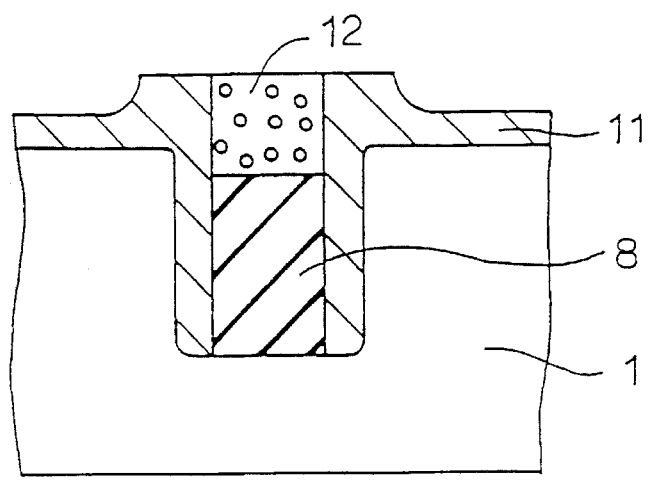

Oxide film 11 and oxide film 12 are etched until a surface of semiconductor layer 3 is exposed. Referring to FIG. 17, only the exposed semiconductor layer 3 is etched away.

Figure 18:
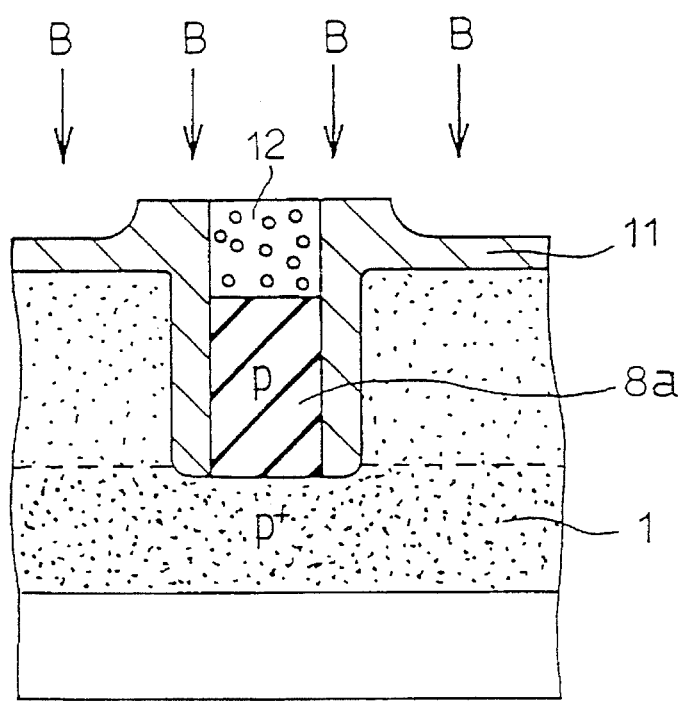
Figure 19:
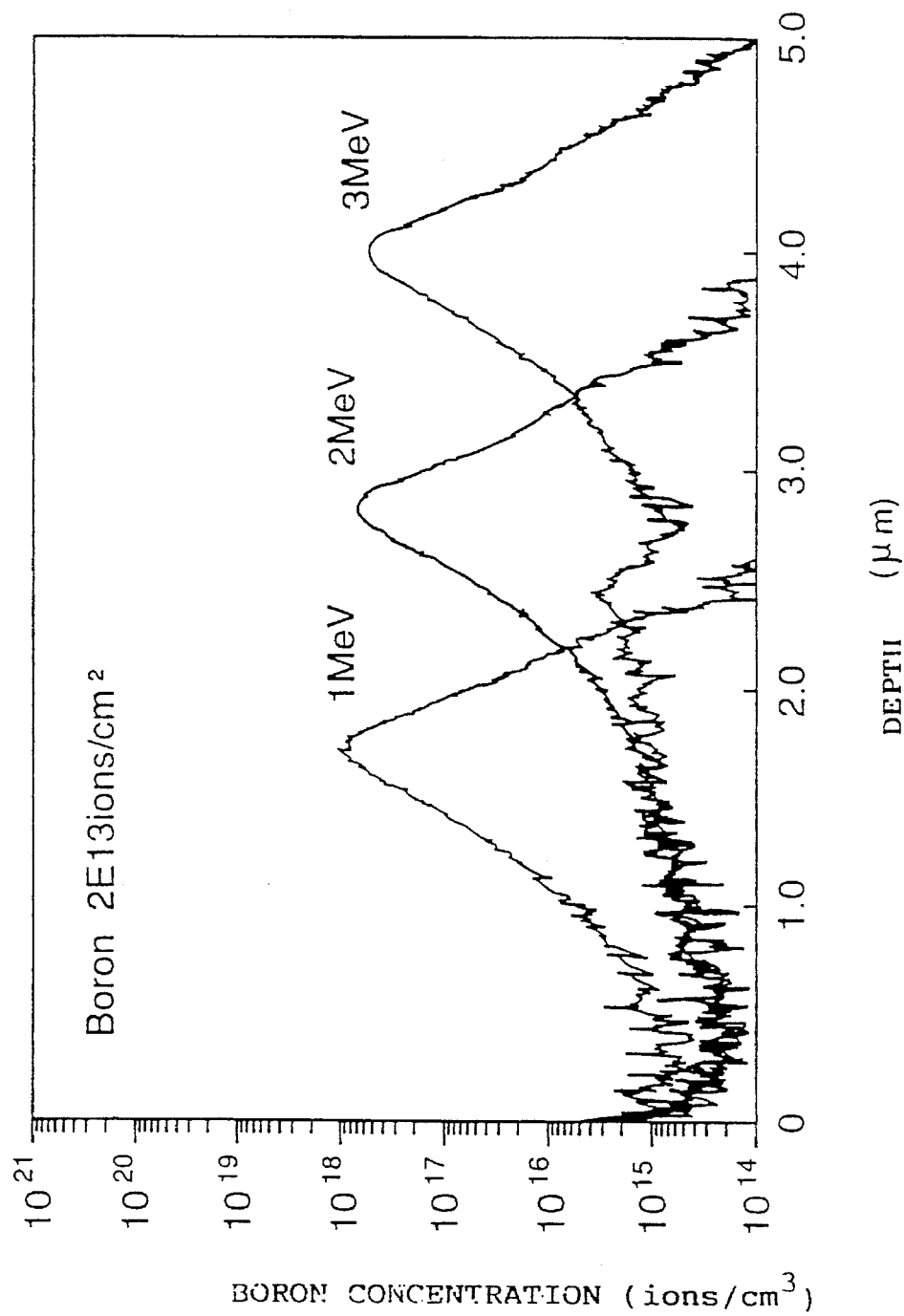
FIG. 19 shows concentration distribution in the substrate when boron is implanted to the substrate at a prescribed energy and a prescribed concentration.

Referring to FIG. 18, impurities of one conductivity type, for example, boron (B) are simultaneously implanted and activated in semiconductor substrate 1 and second semiconductor layer 8 at a constant energy value in a range of 200 KeV–1 MeV and at a constant implantation amount in a range of $1 \times 10^{12}$–$1 \times 10^{15}$ cm$^{-2}$. When, for example, boron is implanted into the substrate under conditions of an implantation amount of $2 \times 10^{13}$ cm$^{-2}$ and energies of 1 MeV, 2 MeV, and 3 MeV, impurity concentration attains the maximum at depths of about 1.7 (μm), 2.8 (μm) and 4.0 (μm), respectively, as shown in FIG. 19. As a result, it is possible to maximize impurity concentration in a bottom portion of the substrate. Semiconductor layer 8 forms an impurity diffusion region 8a. An isolation region of the semiconductor device in this embodiment is then finished.

The number of implantation steps of impurity regions is decreased by employing the isolation structure without a channel stopper as described above. Therefore, the number of steps of forming resist films can be decreased and thus the manufacturing process can be shortened.

Figure 20:
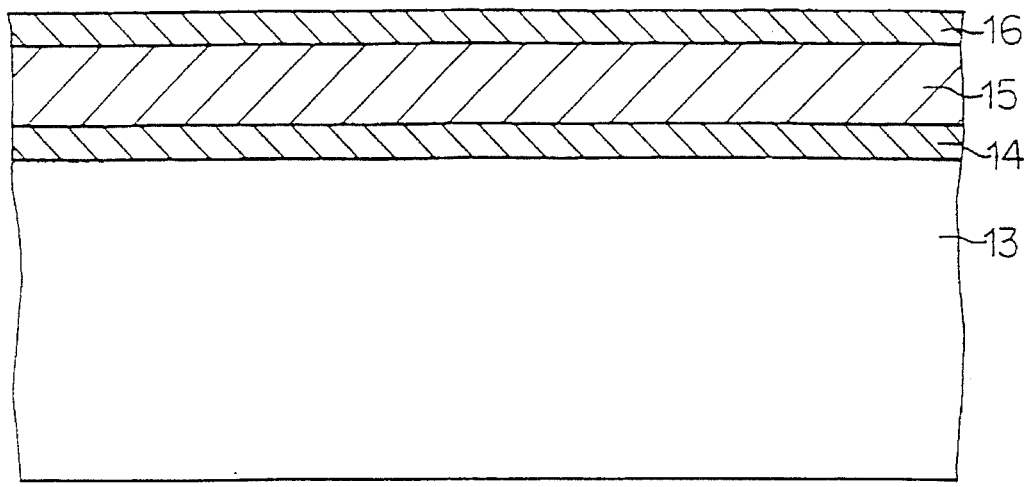
FIGS. 20 through 34 are cross sections showing the first to fifteenth steps of manufacturing a CMOS transistor in accordance with the present invention.

A manufacturing method of a CMOS transistor having the isolation regions of a semiconductor device will be described with reference to FIGS. 20 through 34. Referring to FIG. 20, a first oxide film 14 of SiO$_2$ is formed at a thickness of about 30Å on a surface of a semiconductor substrate 13 using a thermal oxidation method. A first semiconductor layer 15 of polysilicon is formed in a thickness of about 500–2000Å on a surface of first oxide film 14 using a CVD method. Thereafter, a second oxide film 16 of SiO$_2$ is formed in a thickness of about 300Å on a surface of first semiconductor layer 15.

Figure 21:
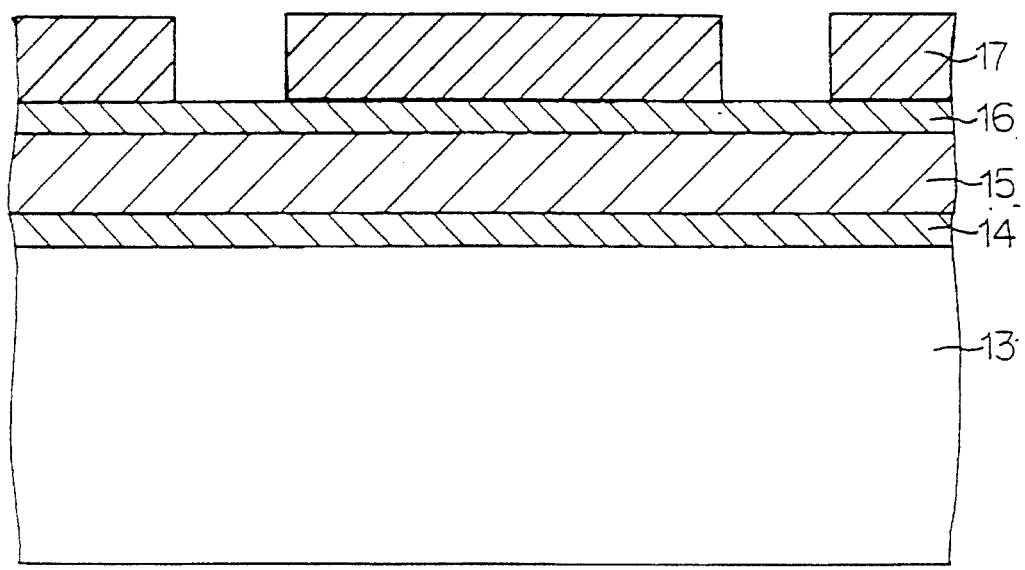
Figure 22:
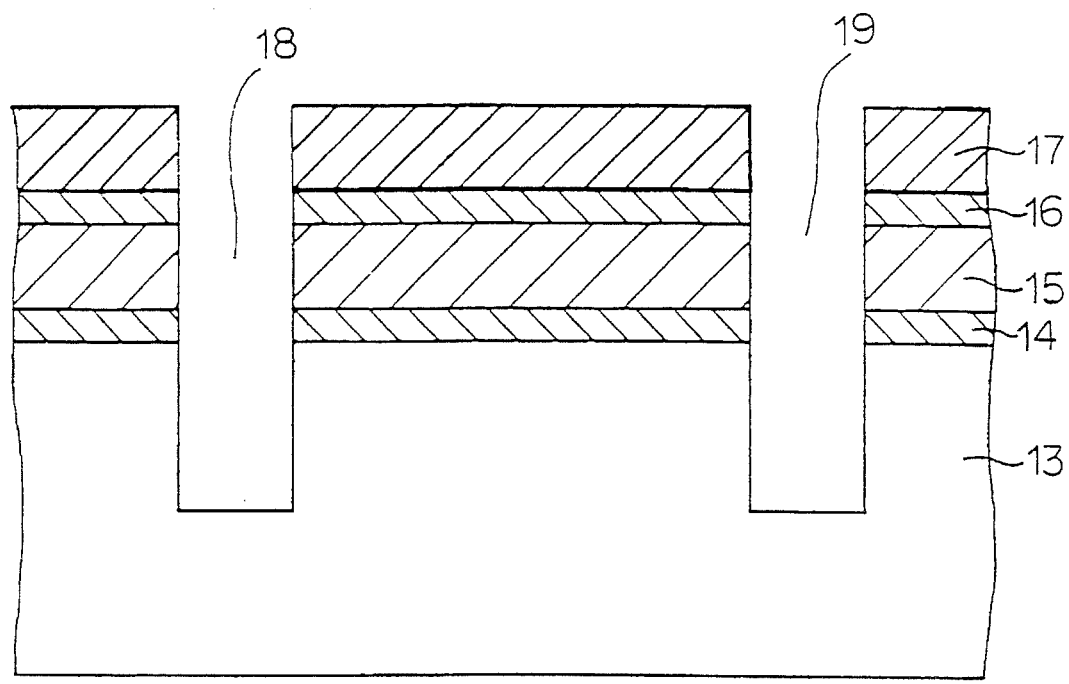

Referring to FIG. 21, a resist film 17 having a pattern for formation of an isolation trench is formed on a surface of second oxide film 16. Referring to FIG. 22, using resist film 17 as a mask, trenches 18, 19 having a depth of about 0.3–1.0 μm are formed using anisotropic etching.

Figure 23:
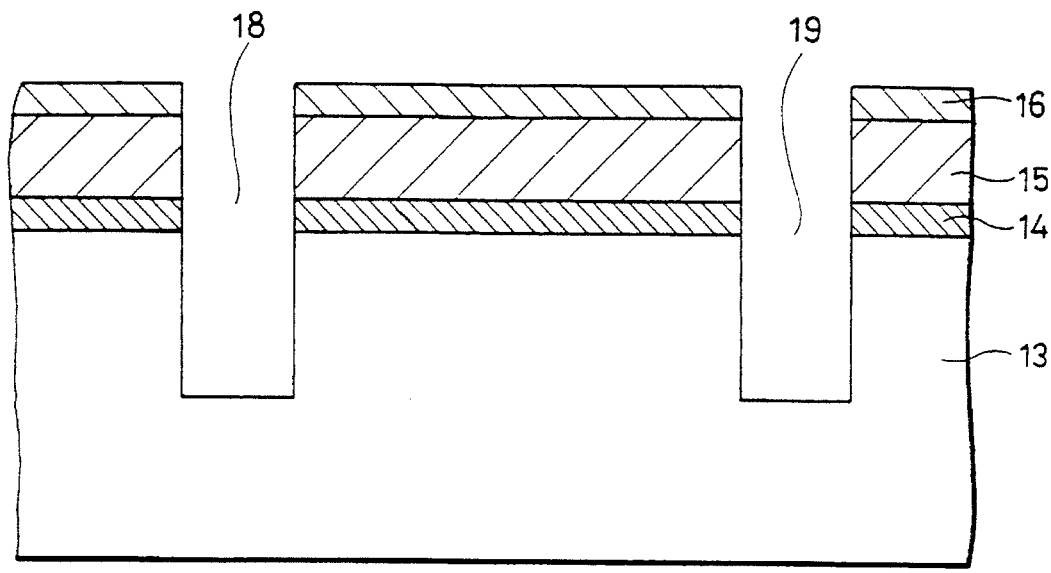
Figure 24:
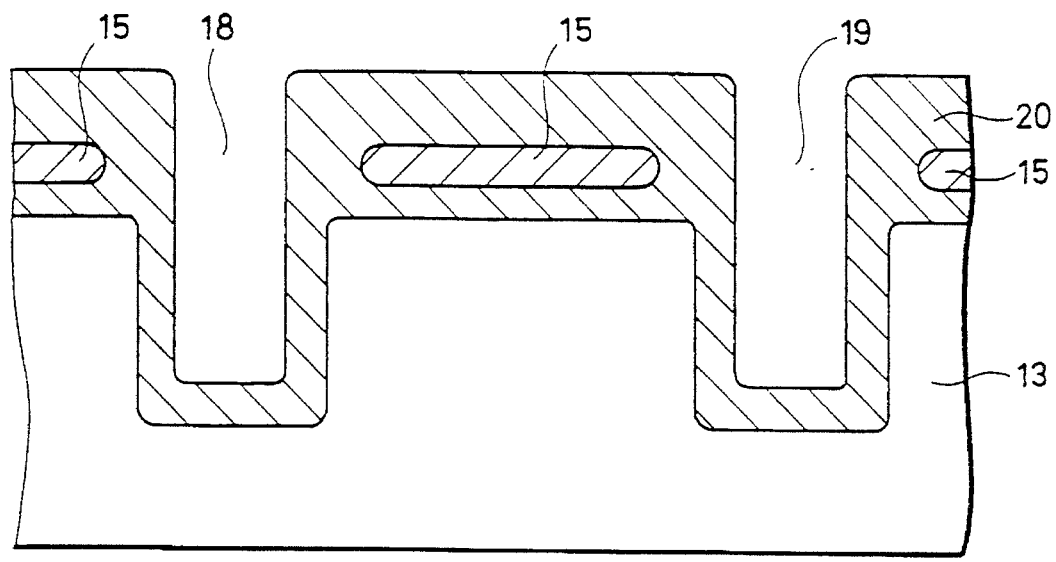

Referring to FIGS. 23 and 24, after resist film 17 is removed, oxide films are formed on internal surfaces of trenches 18, 19. At this time, first semiconductor layer 15 is further oxidized and a second oxide film 16 is thickened. In side surface portions of trenches 18, 19, second oxide film 16 and first oxide film 14 are united. An oxide film thus formed is hereinafter referred to as an oxide film 20.

Figure 25:
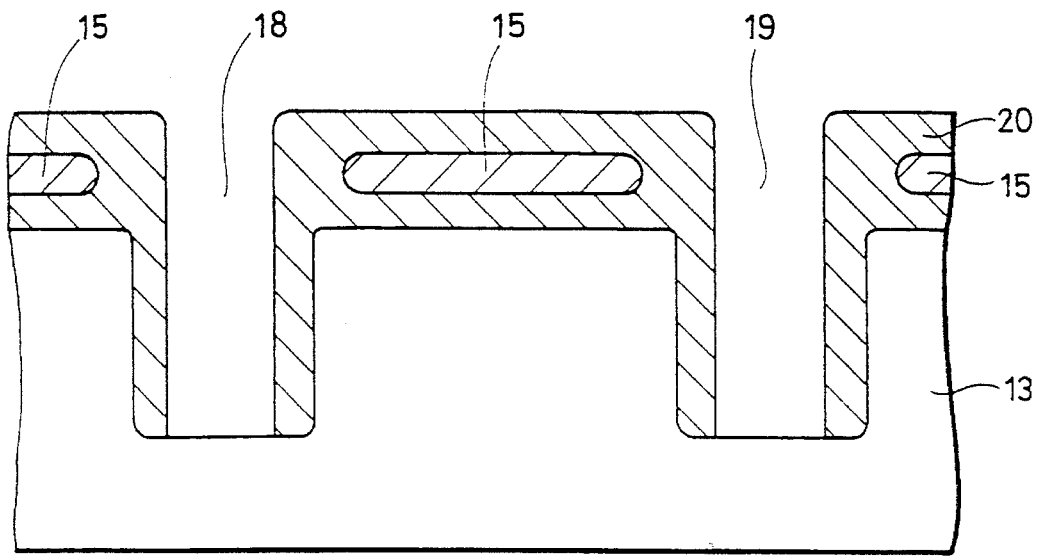
Figure 26:
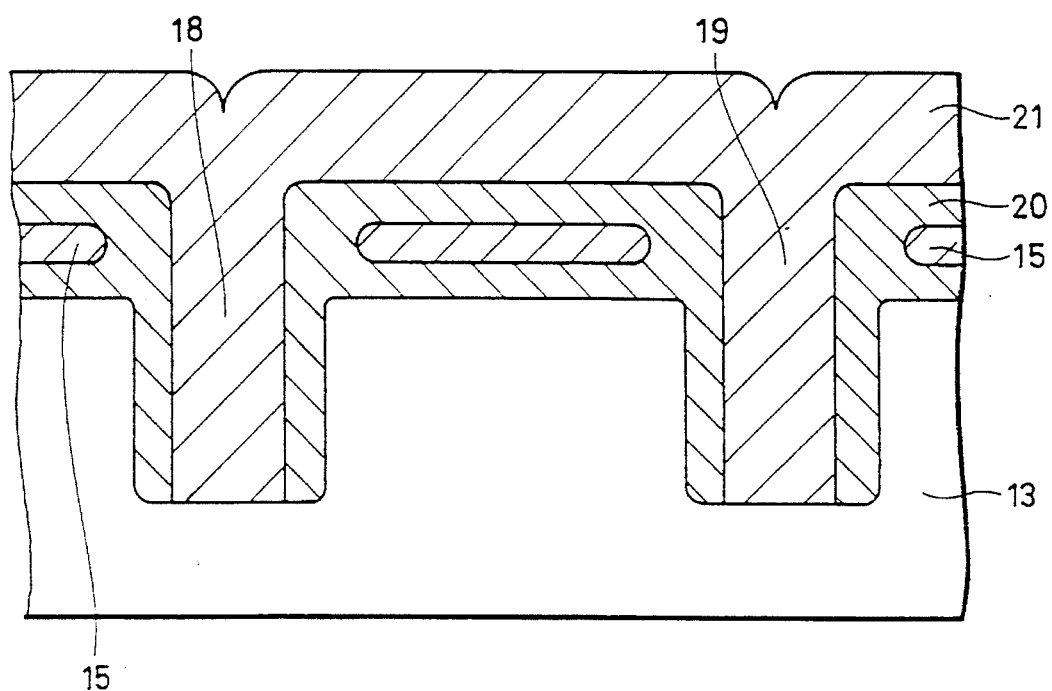

Referring to FIG. 25, oxide film 20 in a bottom surface portions of trenches 18, 19 is etched by anisotropic etching and semiconductor substrate 13 is exposed. Referring to FIG. 26, a second semiconductor layer 21 is formed in a thickness of about 0.1 μm by epitaxial growth, in trenches 18, 19 and on a surface of oxide film 20 using a gas such as $SiCl_4$, $SiHCl_3$, $SiH_2Cl_2$ and $SiH_4$ at a growth rate of about 0.2–1.5 μm/min and grown temperatures in a range of 700° C. to 1200° C.

Figure 27:
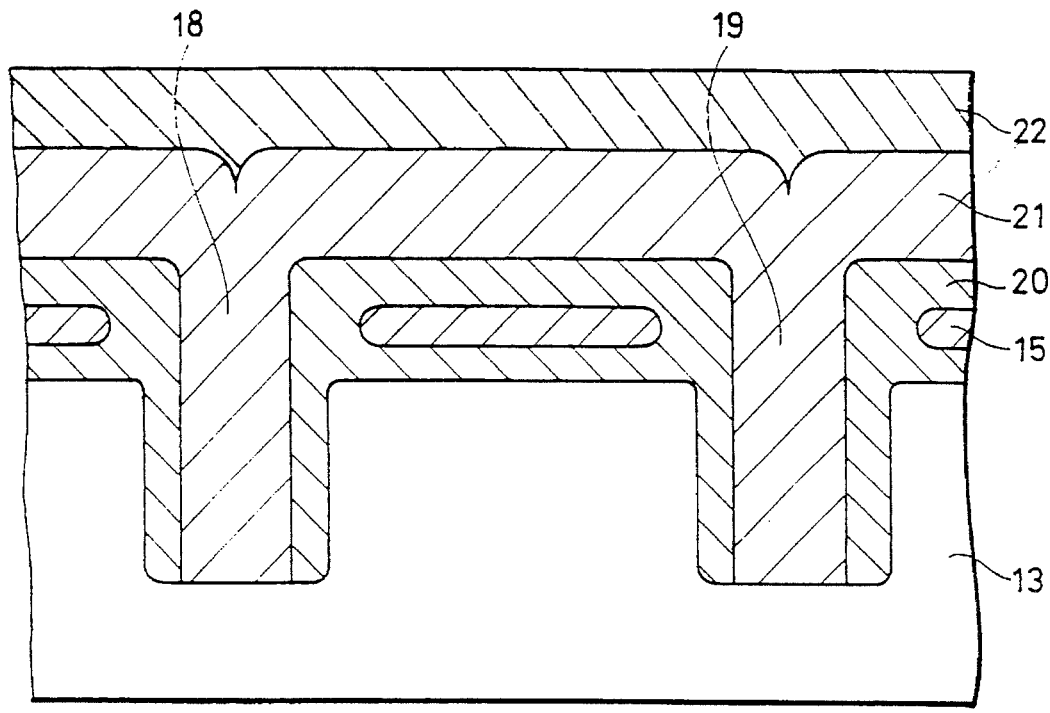
Figure 28:
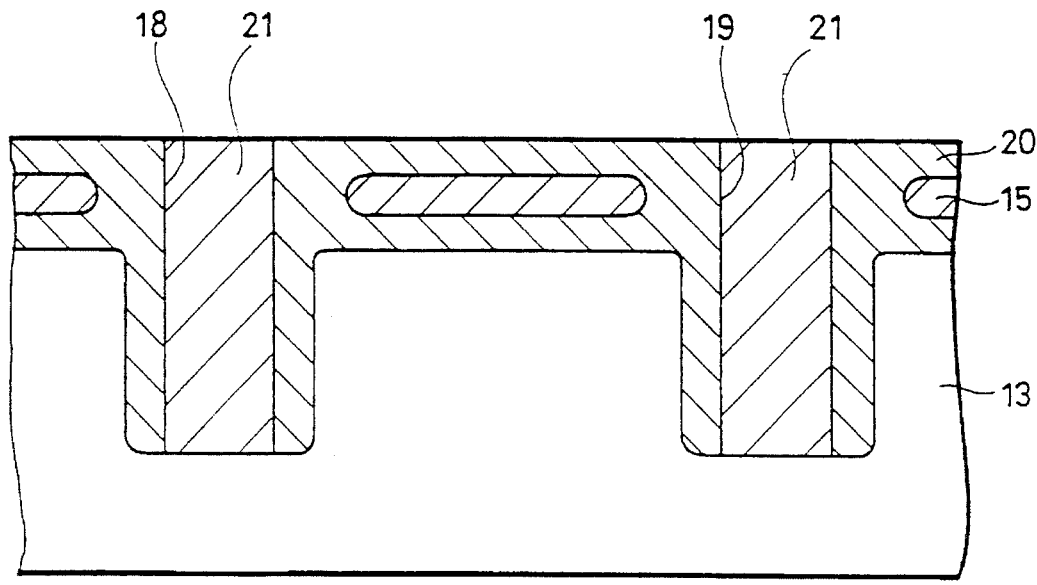
Figure 29:
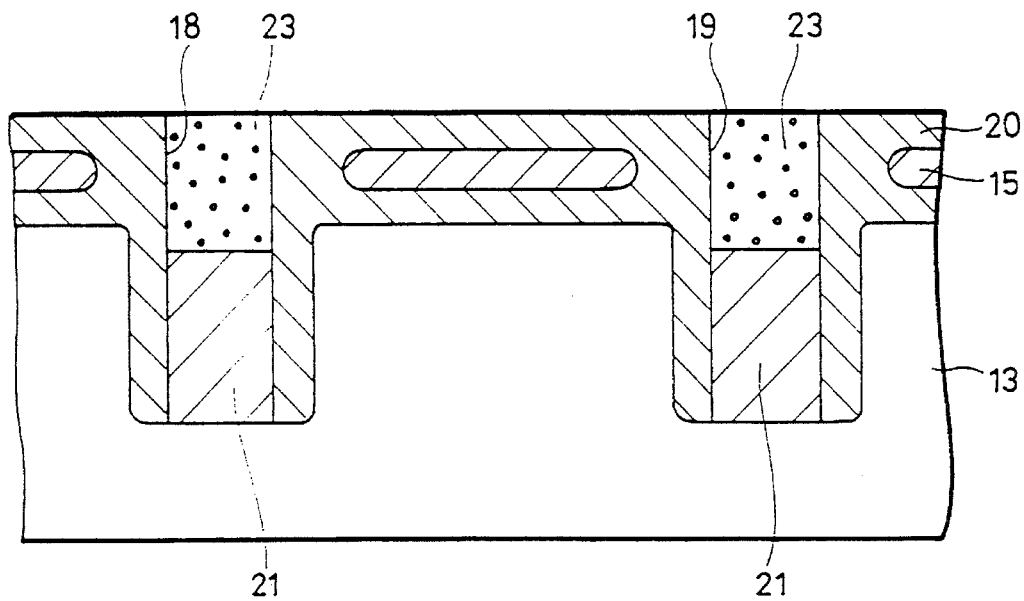

To flatten the surface of semiconductor layer 21, referring to FIGS. 27 and 28, a resist film 22 is formed flat on a surface of semiconductor layer 21 and etched back to a predetermined depth. In this etching, $CCl_4$ for etching semiconductor layer 21 is mixed with $O_2$ for etching resist film 22 such that both etching rates are equal. Referring to FIG. 29, impurities are thermally diffused more deeply than a surface of semiconductor substrate 1 in semiconductor layer 21, and an oxide film 23 is formed.

Figure 30:
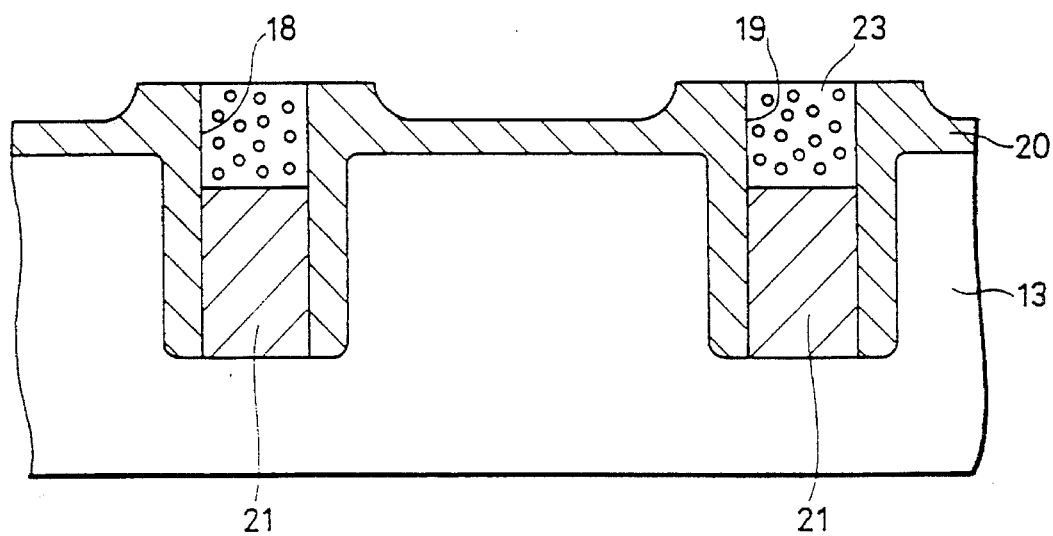

Oxide film 20 and oxide film 23 are etched until a surface of semiconductor layer 15 is exposed. Referring to FIG. 30, only the exposed semiconductor layer 15 is etched away.

Figure 31:
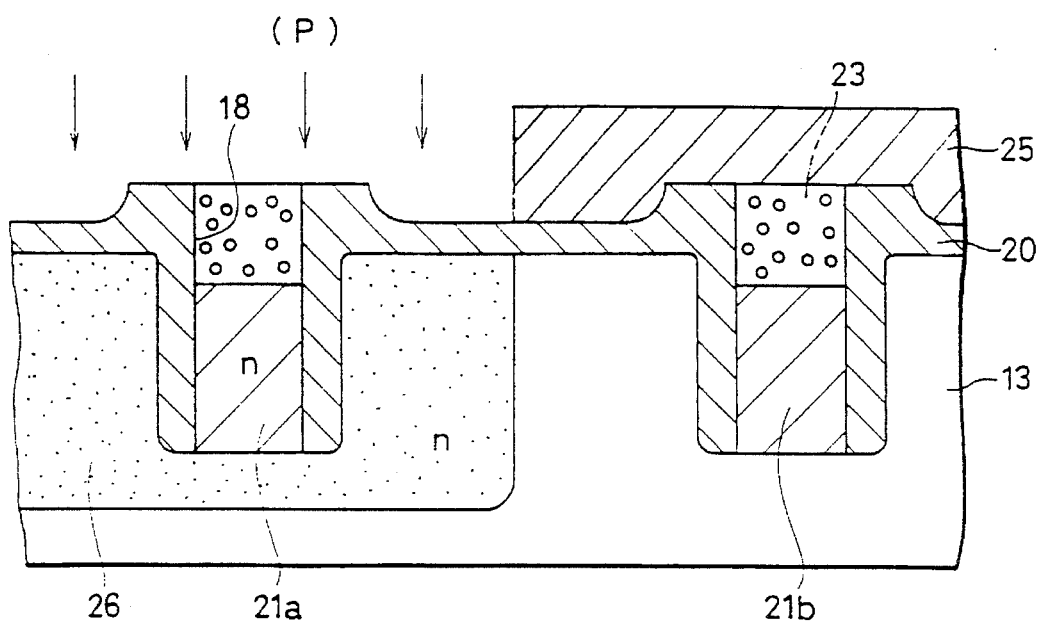

Referring to FIG. 31, a resist film 25 is formed on a right half surface of oxide film 20. Using resist film 25 as a mask, phosphorus (P) is implanted at a constant energy values in a range of 500 KeV–1.5 MeV and at a constant implantation amount in a range of $1\times10^{12}$–$1\times10^{15}$ $cm^{-2}$. Thermal diffusion is carried out at a temperature of 800°–1200° C. for 20 minutes–10 hours to form an n type diffusion impurity region 26 whose impurity concentration attains the maximum in a bottom portion of the substrate. At this time, phosphorus (P) is simultaneously implanted and diffused in second semiconductor layer 21 formed in trench 18, and an n type impurity diffusion layer 21a is formed.

Figure 32:
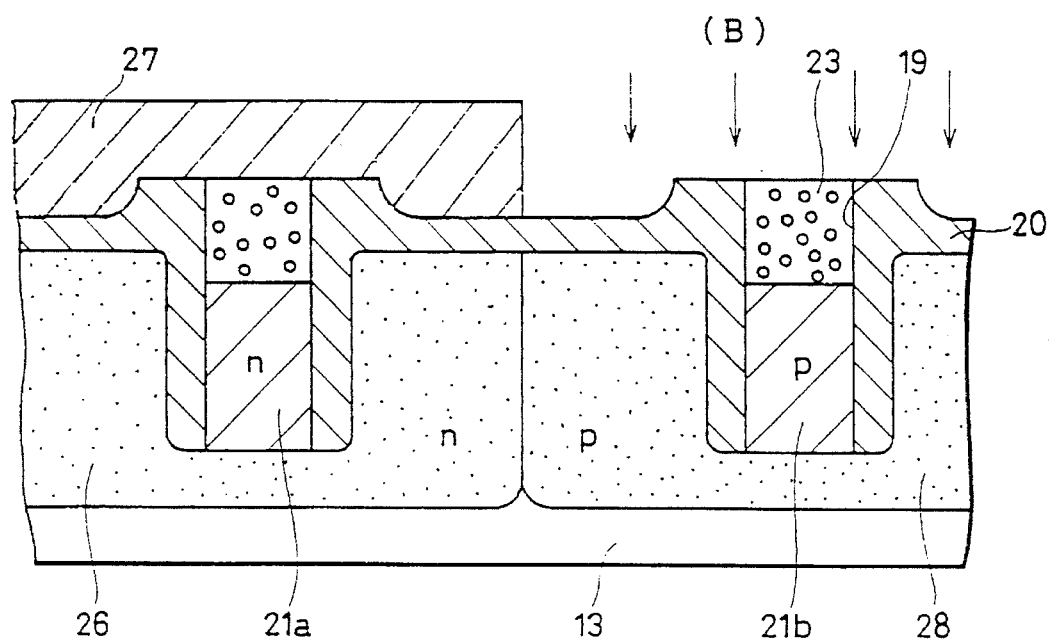

Referring to FIG. 32, a resist film 27 is formed on a left half surface of oxide film 20 in the same manner as is described above. Using resist film 27 as a mask, boron (B) is implanted and diffused to a predetermined depth in a right half of semiconductor substrate 13, and a p type impurity diffusion region 28 is formed. Simultaneously, boron (B) is also implanted into a second semiconductor device 21 formed in trench 19 under conditions of respective constant values in a range of 200 KeV–1 MeV and $1\times10^{12}$–$1\times10^{15}$ $cm^{-2}$. Thermal diffusion is carried out at a temperature of 800°–1200° C. for 20 minutes–10 hours and p type impurity diffusion layer 21b is then formed whose impurity concentration attains the maximum in a bottom portion of the substrate.

Figure 33:
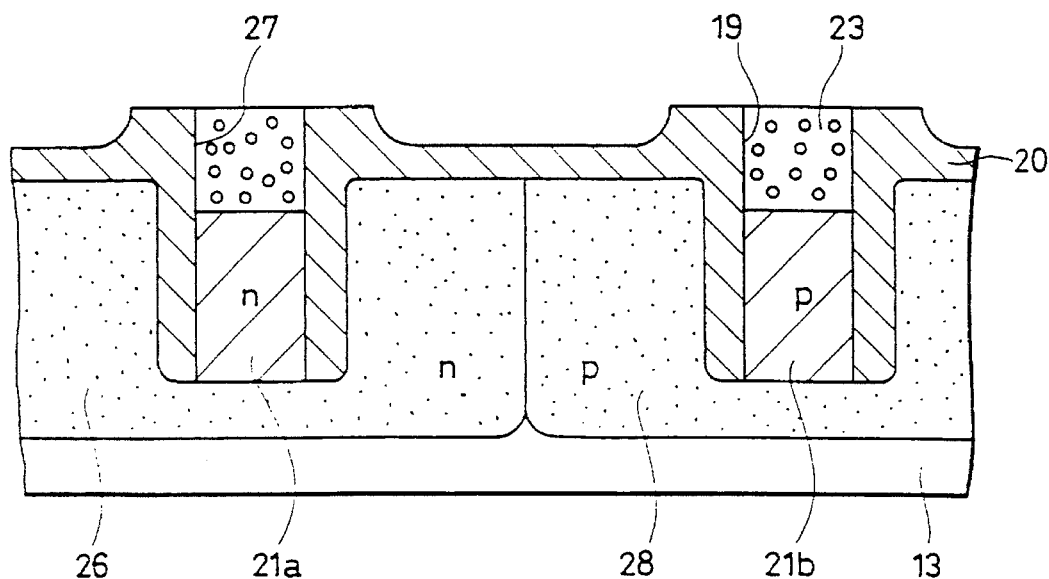

Resist film 27 is removed, so that an isolation region used for a CMOS transistor as shown in FIG. 33 is finished.

Figure 34:
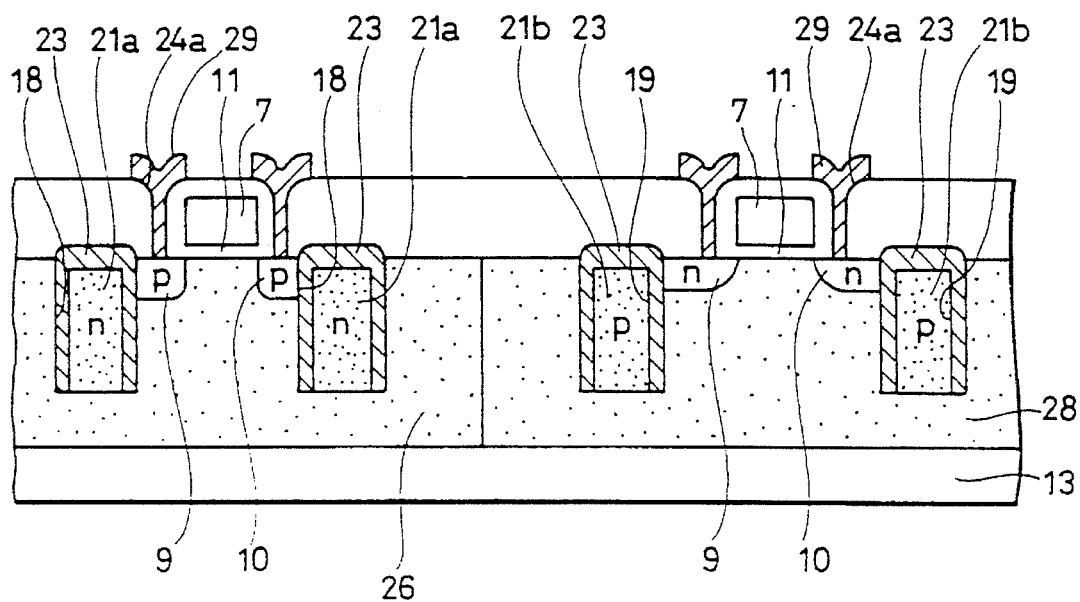

Thereafter, gate oxide film 11 is deposited and gate electrode 7 is formed. Gate electrode 7 is etched to a predetermined shape using photolithography. Source/drain regions 9, 10 are formed in respective wells. An interlayer oxide film 24 is deposited on the whole surface of the substrate. Contact holes 24a reaching source/drain regions 9, 10 are opened using photolithography. Aluminum 29 is deposited by sputtering and etched by photolithography. An CMOS transistor as shown in FIG. 34 is then finished.

Although, in the above embodiment, an epitaxial layer is formed to form the p type impurity diffusion region in the second semiconductor layer formed in the trench, metallic material of tungsten (W) may be deposited instead. In this case, a mixed gas of $Wf_6$ and $SiH_4$, or $Wf_6$ and $H_2$ is used at temperatures in range of about 400°– 1000° C. in the CVD method. When the second semiconductor layer is formed of tungsten (W), impurities are not diffused into the layer but only into the semiconductor substrate.

For the CMOS transistor having the isolation structure without a channel stopper, as described above, the number of implantation steps of impurities is decreased, the number of steps of forming resist films is decreased to a half, so that the number of manufacturing steps can be decreased.

In the embodiments according to the present invention, since a channel stopper region needed in a bottom portion of a trench in a conventional case is not provided, it is possible to shorten the manufacturing process. Particularly, when a semiconductor device of the structure according to the present embodiment is used in a CMOS transistor, it is possible to greatly shorten the manufacturing process, to increase reliability of products and to reduce the cost.

A second embodiment of the present invention will be described.

Figure 35:
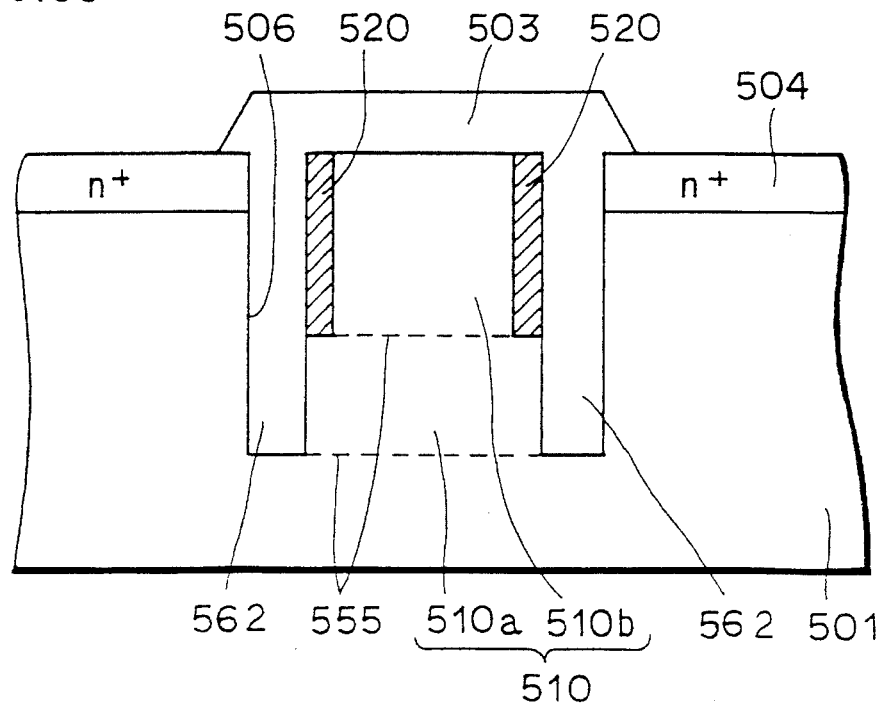
FIG. 35 is cross section showing a structure of a semiconductor device in accordance with a second embodiment of the present invention.

The element isolating structure of the embodiment will be described with reference to FIG. 35.

A trench 506 is formed to have the depth of about 1 to 2μ from the main surface of a p type semiconductor substrate 501. A pair of sidewall insulating films 562 and 562 of oxide films are formed on the sidewalls of the trench 506. In the trench 506 surrounded by the pair of sidewall insulating films 562 a buried layer 510 having the impurity concentration in the range of $1\times10^{14}$ to $1\times10^{17}$ $cm^{-3}$ is provided. In this embodiment, the buried layer 510 has a two layered structure including a lower buried layer 510a and an upper buried layer 510b. The upper opening portion of the trench 506 is covered by an upper insulating film 503 of an oxide film. In the region of the buried layer 510, a pair of conductive layers 520 and 520 having the impurity concentration of about $1\times10^{18}$ to $1\times10^{21}$ $cm^{-3}$ are provided in contact with the lower surface of the upper insulating film 503 and inner surfaces of the sidewall insulating films 562 and near the side portions of the buried layer are provided.

Figure 36:
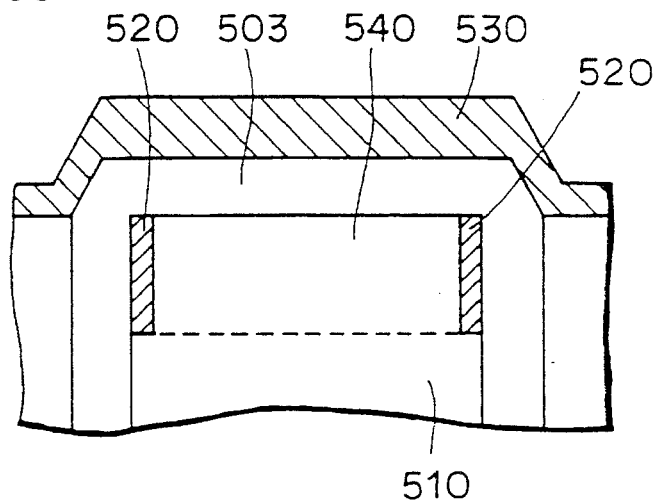
FIG. 36 is a schematic diagram showing operation principal of the structure shown in FIG. 35.

A case in which a gate electrode 530 is provided on the above described element isolating structure will be described with reference to FIG. 36.

Figure 37:
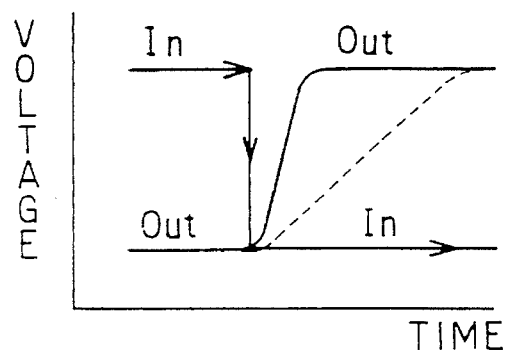
FIG. 37 shows relation between time and voltage showing the effect provided by the structure of FIG. 35.
Figure 38:
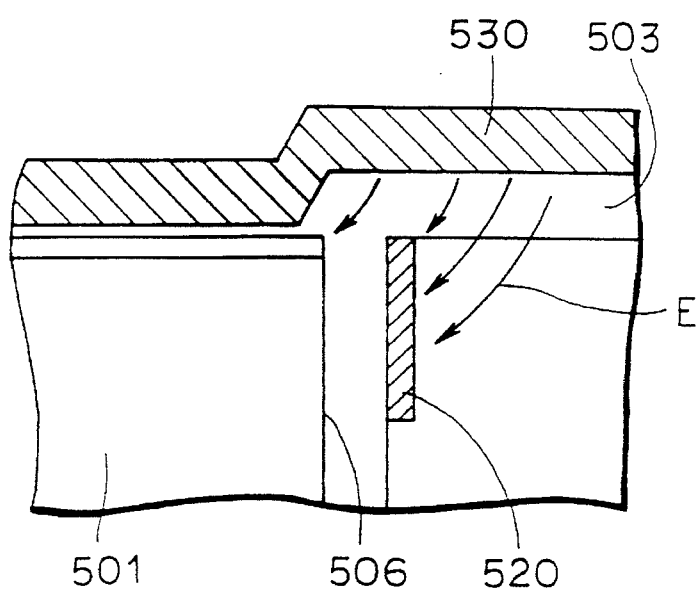
FIG. 38 is a schematic diagram showing another effect provided by the structure shown in FIG. 35.
Figure 39:
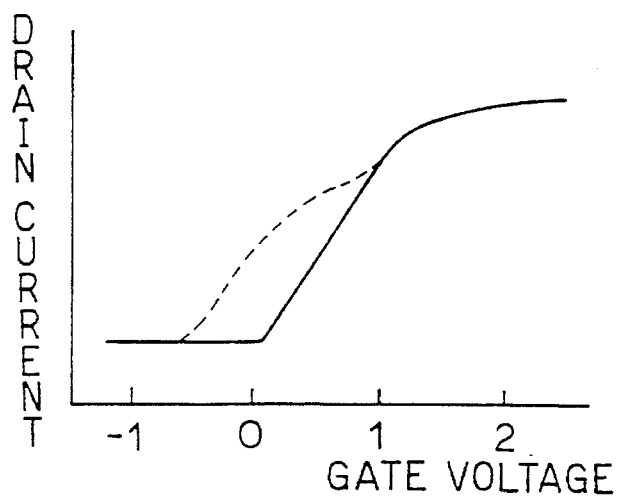
FIG. 39 shows relation between the gate voltage and the drain current showing the effect provided by the structure of FIG. 35.

In the structure of the above embodiment, since the buried layer 510 having low impurity concentration is positioned at the lower surface of the upper insulating film 503, the depletion layer 540 is formed entirely over the upper region of the buried layer 510. Therefore, the parasitic capacitance of the capacitor formed by the gate electrode 530, the upper electrode 503 and the buried layer 510 can be reduced. Consequently, speed of operation of the device isolated by this element isolating structure can be improved as shown in FIG. 37. In addition, with respect to the electric field E from the gate electrode 530, the electric field E can be shielded by the conductive layers 520, as shown in FIG. 38. Therefore, the conductive layer 520 prevents inversion of the semiconductor substrate 501 at the edge portion of the trench 506. Thus the parasitic component of the transistor is cut, and a phenomenon in which the channel is not completely turned OFF can be prevented as shown in FIG. 39, allowing reduction of power.

The method of manufacturing the above described element isolation will be described with reference to FIGS. 40 to 50. FIGS. 40 to 50 are cross sections in accordance with the cross sectional structure shown in FIG. 35.

Figure 40:
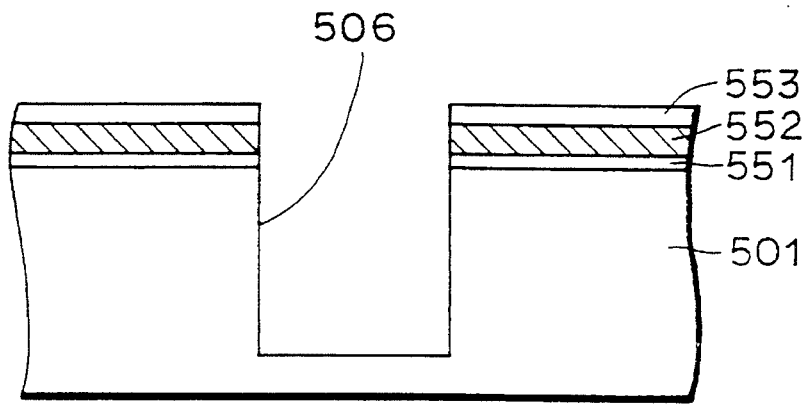
FIGS. 40 to 50 are cross sections showing the first to eleventh steps of manufacturing in accordance with the second embodiment of the present invention.

Referring to FIG. 40, a first oxide film 551 of $SiO_2$ is formed to have the thickness of about 300Å by thermal oxidation on the surface of the semiconductor substrate 501. A silicon nitride film 552 is formed by the CVD method to the thickness of about 2000Å on the surface of the first oxide film 551. Thereafter, a second oxide film 553 of $SiO_2$ is formed to the thickness of about 2000Å by thermal oxidation on the silicon nitride film 512.

Thereafter, a resist film having a prescribed pattern (not shown) is formed on the second oxide film 513. Thereafter, by using the resist film as a mask, a trench 506 having the depth of about 0.3 to 1.0μ is formed by an isotropic etching.

Figure 41:
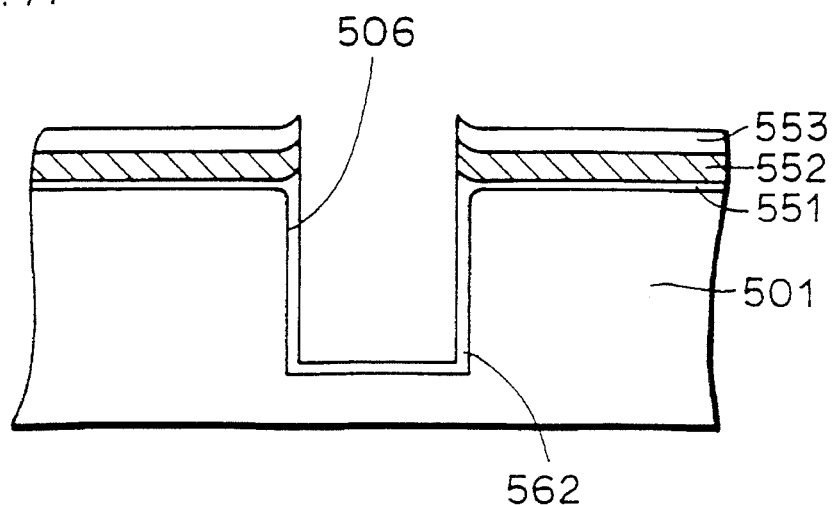
Figure 42:
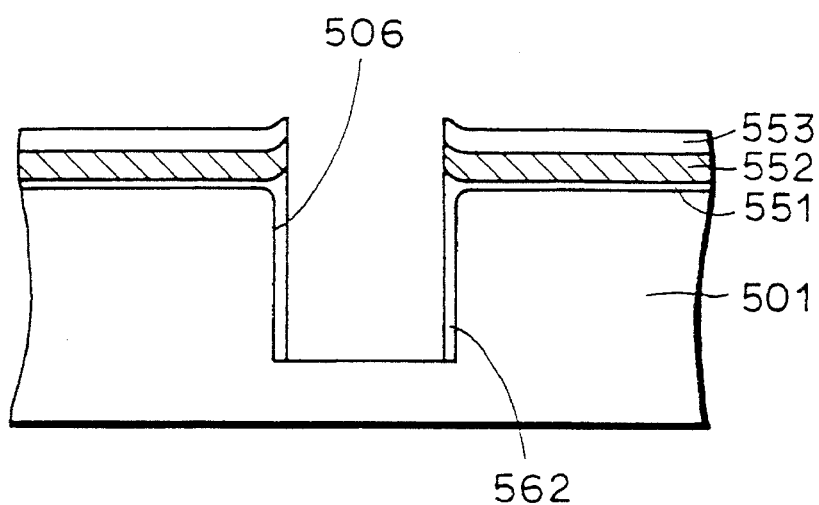

Then, referring to FIG. 41, the resist film is removed, and an oxide film 562 having the thickness of about 300Å is formed on the inner surface of the trench 506 by thermal oxidation. Thereafter, referring to FIG. 42, the oxide film 562 formed at the bottom portion of the trench 506 only is removed by anisotropic etching.

Figure 43:
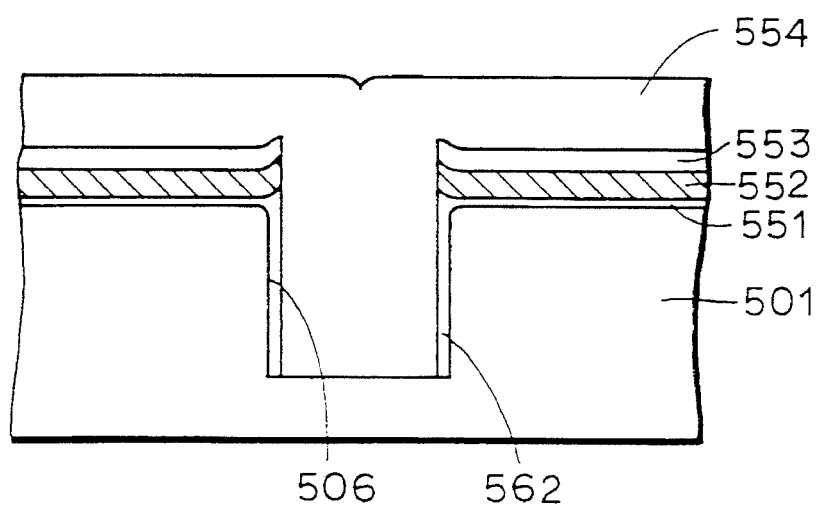
Figure 44:
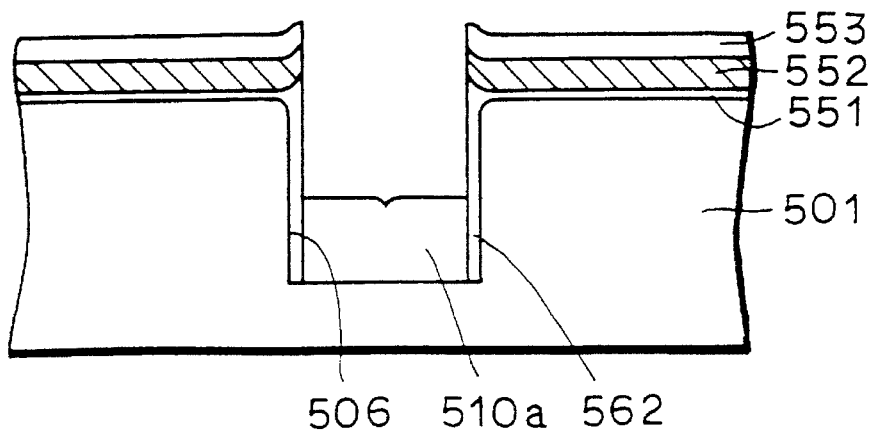

Thereafter, referring to FIG. 43, a polysilicon having the low impurity concentration of about $1 \times 10^{14}$ cm$^{-3}$ is deposited by the CVD method on the entire surface of the substrate. Then, referring to FIG. 44, the polysilicon layer 55 is etched back to lead the polysilicon layer 554 at a prescribed region at the bottom of the trench 506 only, to form the lower buried layer 510a.

Figure 45:
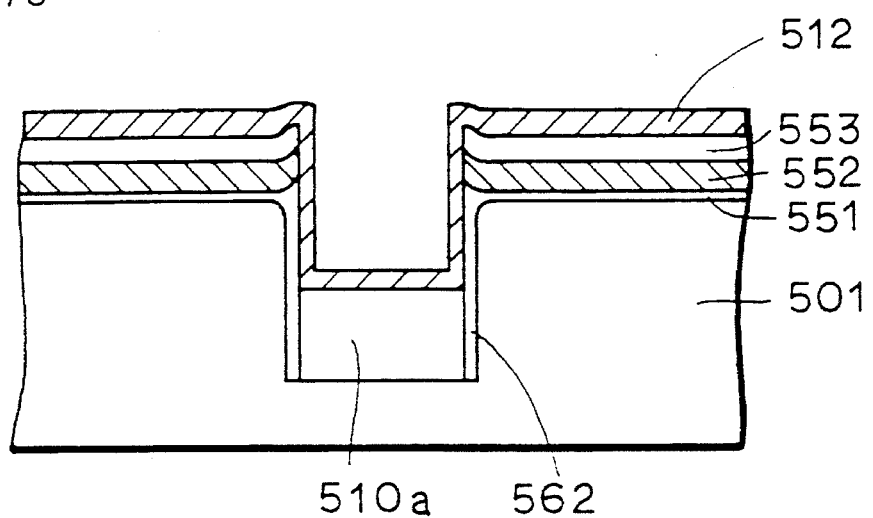

Then, referring to FIG. 45, a high concentration polysilicon 512 having the impurity concentration of $1 \times 10^{18}$ cm$^{-3}$ or higher is formed on the entire surface of the substrate by the CVD method, to the thickness of about 200 to 3000Å. The high concentration polysilicon layer 512 has the same conductivity as the substrate, and in this embodiment, it has p type conductivity.

Figure 46:
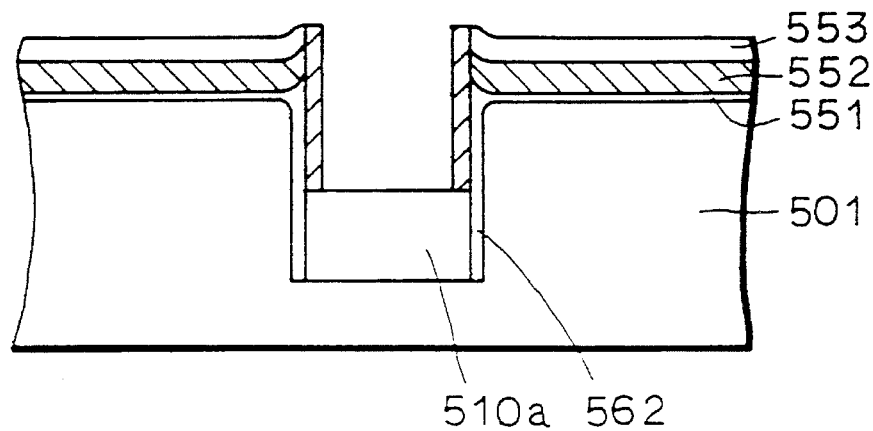
Figure 47:
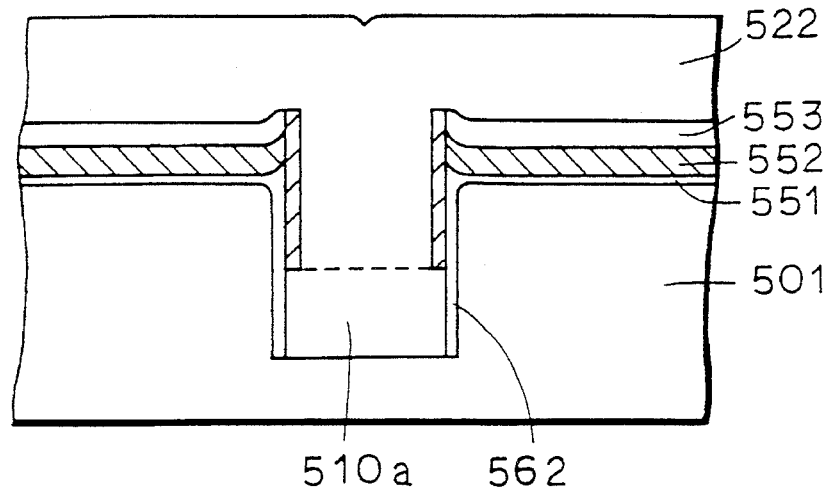

Then, referring to FIG. 46, the polysilicon layer 512 formed at the upper portion of the lower buried layer 510a is removed by anisotropic etching.

Figure 48:
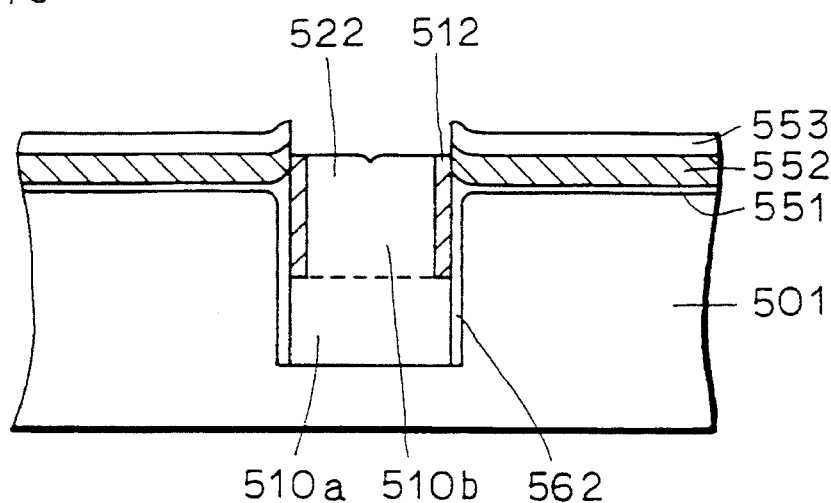

Then, referring to FIG. 48, the polysilicon layer 522 is etched back. Thus an upper buried layer 510b is formed in the trench 506.

Figure 49:
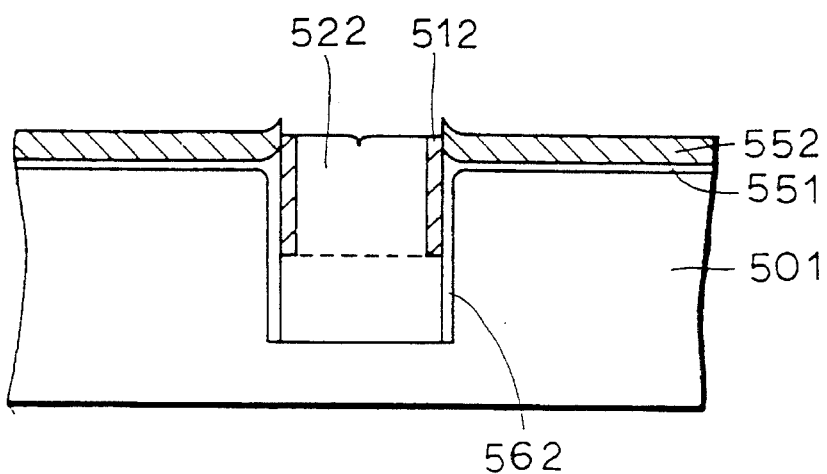
Figure 50:
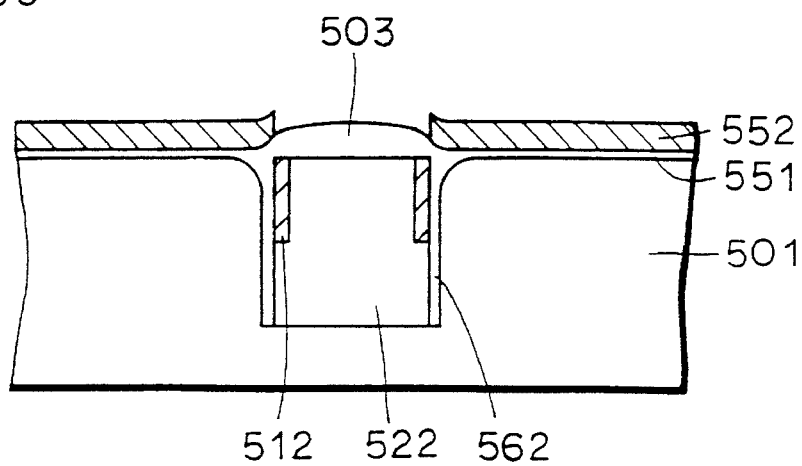

Then, referring to FIG. 49, the second oxide film 553 shown in FIG. 48 is removed by etching. Thereafter, as shown in FIG. 50, an upper insulating film 503 is formed by using the silicon nitride film 553 as a mask by a method similar to the conventional LOCOS method, by thermal oxidation. Thereafter, the silicon nitride film 553 is removed by wet etching using phosphoric acid, and the element isolation structure shown in FIG. 35 is thus completed.

As described above, by this embodiment, a pair of conductive layers having higher impurity concentration than the buried layer are provided near the side portions of the buried layer and in contact with the lower surface of the upper insulating film and in contact with the inner surfaces of the sidewall insulating films. Thus the impurity concentration of the buried layer as a whole can be set lower, suppressing parasitic resistance. In addition, as to the electric field from the gate electrode, the electric field is suppressed by the conductive layers and thus formation of inverted layer at the sidewall portions of the trench can be prevented.

A third embodiment of the present invention will be described.

Figure 51:
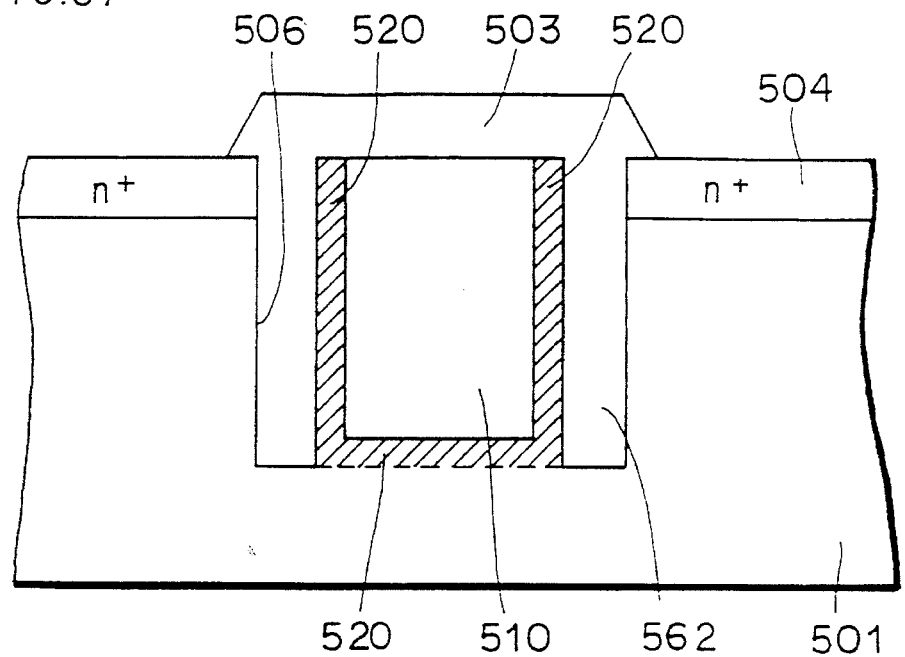
FIG. 51 is a cross section showing a structure of a semiconductor device in accordance with a third embodiment of the present invention.

Referring to FIG. 51, the element isolating structure of this embodiment will be described.

The element isolating structure of the third embodiment differs from the structure of the second embodiment described above in the following points.

First, the conductive layers 520 and 520 are formed to the bottom of the trench 506. At the bottom of the trench 506, a bottom conductive layer 522 is formed. The buried layer 510 is entirely formed of polysilicon layer of low impurity concentration.

As to the impurity concentration of the buried layer 510 as a whole, it should preferably be low in view of parasitic capacitance. Therefore, the ratio of the buried layer 510 occupied by the conductive layer 522 should be as small as possible. However, in the structure of the second embodiment, during the steps of manufacturing, there may possibly be a natural oxide film 555 formed between the semiconductor substrate 501 and the lower buried layer 510b and between the lower buried layer 510b and the upper buried layer 510a. Because of the natural oxide film 555, conductivity between the buried layer 510 and the semiconductor substrate 510 cannot be ensured, causing potential difference between the buried layer 510 and the semiconductor substrate 501.

The third embodiment is made to solve the above described the problem of the second embodiment.

As shown in FIG. 51, by providing the bottom portion conductive layer 522 at the bottom of the trench 506, conductivity between the semiconductor substrate 501 and the buried layer 510 can be ensured, and therefore the potentials of the semiconductor layer 501 and of the buried layer 510 can be surely kept at the same potential.

Manufacturing steps of the element isolating structure described above will be described with reference to FIGS. 52 to 59. FIGS. 52 to 59 are cross sections in accordance with the cross sectional structure shown in FIG. 51.

Figure 52:
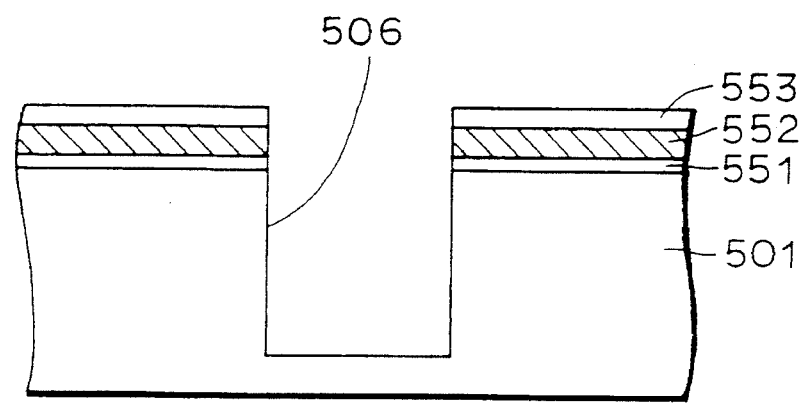
FIGS. 52 to 59 are cross sections showing the first to eighth steps of manufacturing in accordance with the third embodiment of the present invention.

Referring to FIG. 52, a first oxide film 551 of $SiO_2$ is formed to the thickness of 300Å by thermal oxidation on the surface of the semiconductor substrate 501. A silicon nitride film 552 having the thickness of about 2000Å is formed on the surface of the first oxide film 551. Further, a second oxide film 553 is formed to the thickness of about 2000Å by thermal oxidation on the silicon nitride film 552.

Then, a resist film having a prescribed pattern (not shown) is formed on the second oxide film 553. Thereafter, by using the resist film as a mask, a trench 506 having the depth of about 0.3 to 1.5μ is formed by anisotropic etching.

Figure 53:
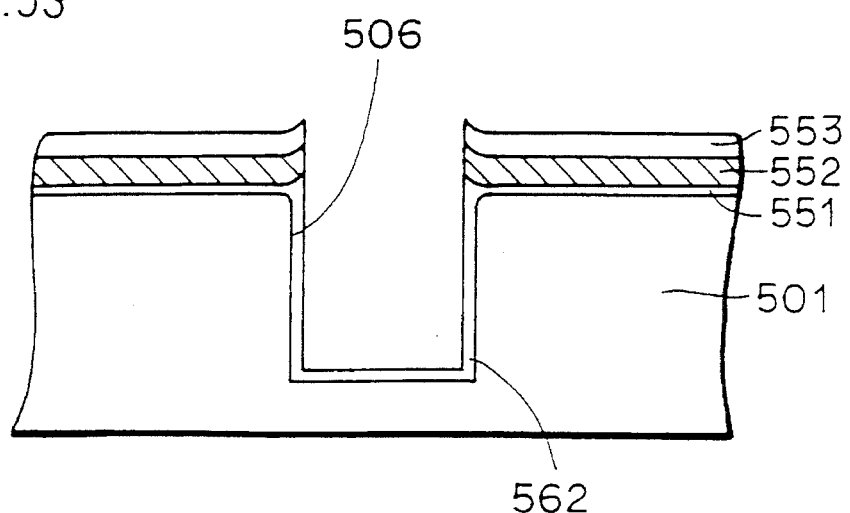
Figure 54:
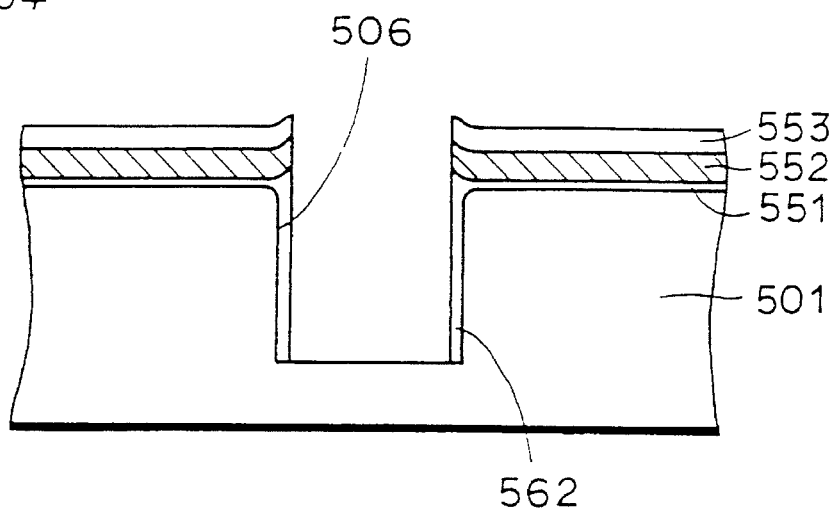

Then, referring to FIG. 53, after the resist film is formed, sidewall oxide films 562 are formed on the sidewalls of the trench 506 by thermal oxidation. Thereafter, the sidewall oxide film 562 formed at the bottom of the trench 506 only is removed by anisotropic etching.

Figure 55:
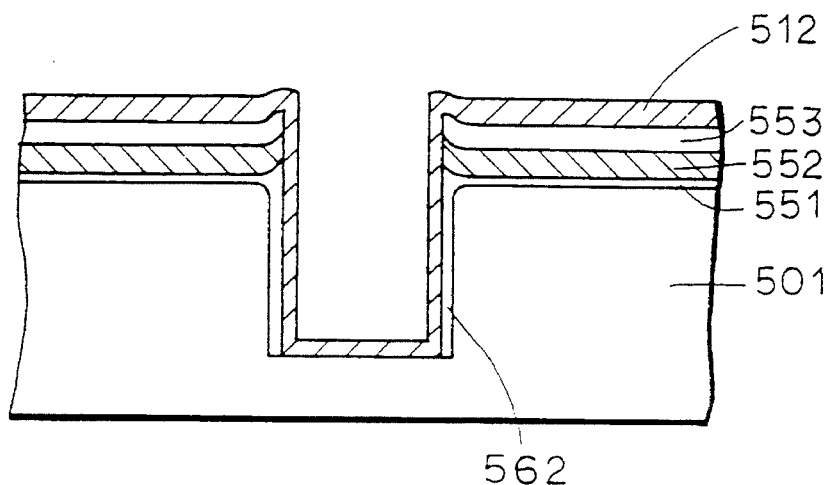

Then, referring to FIG. 55, a polysilicon 512 of high concentration having the impurity concentration of $1 \times 10^{18}$ cm$^{-3}$ or higher is deposited to the thickness of about 200 to 3000Å by the CVD method on the entire surface of the substrate. The same conductivity as the substrate is selected as the conductivity of the impurities, and in this embodiment, it has p type conductivity.

Figure 56:
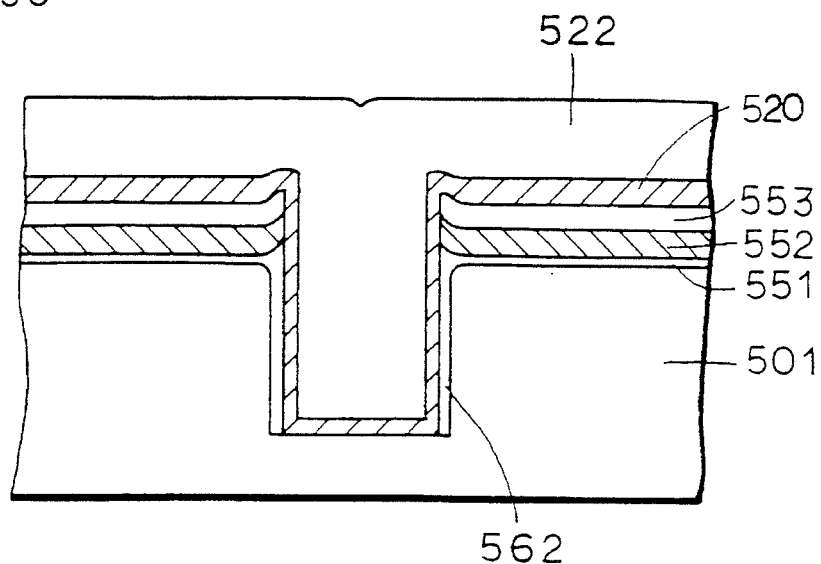

Then, as shown in FIG. 56, a polysilicon not doped with impurities is deposited on the entire surface of the substrate. At this time, the sum of the thickness of the high concentration polysilicon layer 512 and the thickness of the polysilicon layer 522 should be about 1.5 times that of the width of the trench 506.

Figure 57:
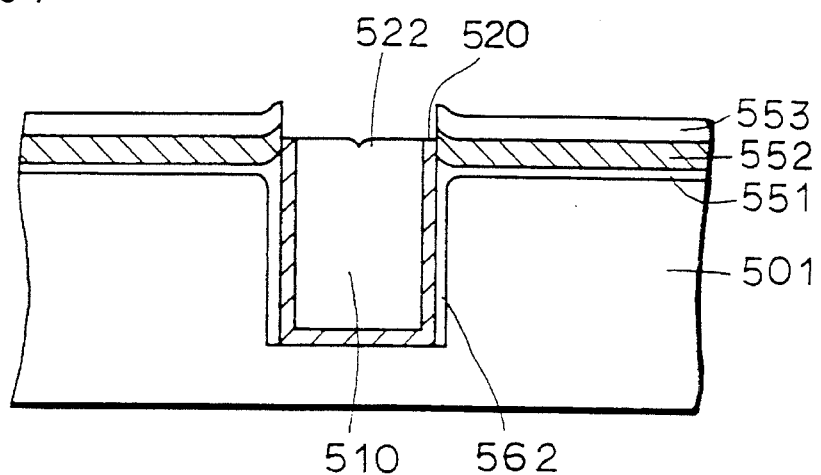
Figure 58:
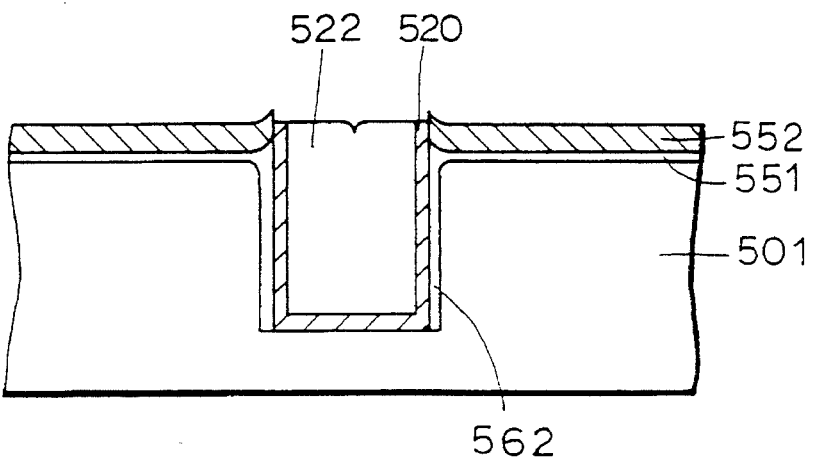

Then, referring to FIG. 57, the polysilicon layer 522 is removed by etchback to leave the polysilicon layer only in the trench 506 and to form the buried layer 510. Then, referring to FIG. 58, the second oxide film 553 is removed by wet etching.

Figure 59:
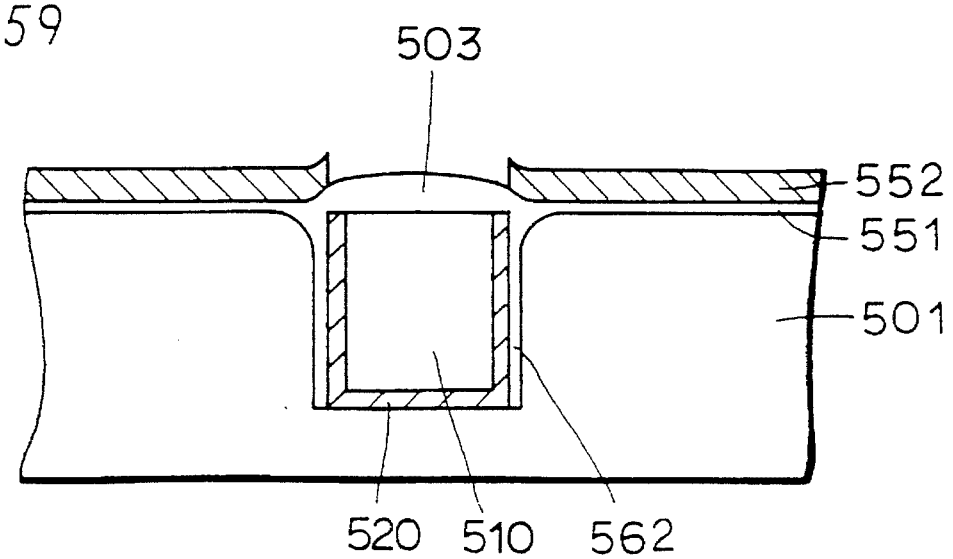

Then, referring to FIG. 59, the upper insulating film 503 is formed by using the silicon nitride film 553 as a mask by a similar method as the common LOCOS method, by thermal oxidation. Thereafter, by removing the silicon nitride film 553 by wet etching, the element isolating structure in accordance with the third embodiment shown in FIG. 51 is completed.

Figure 60:
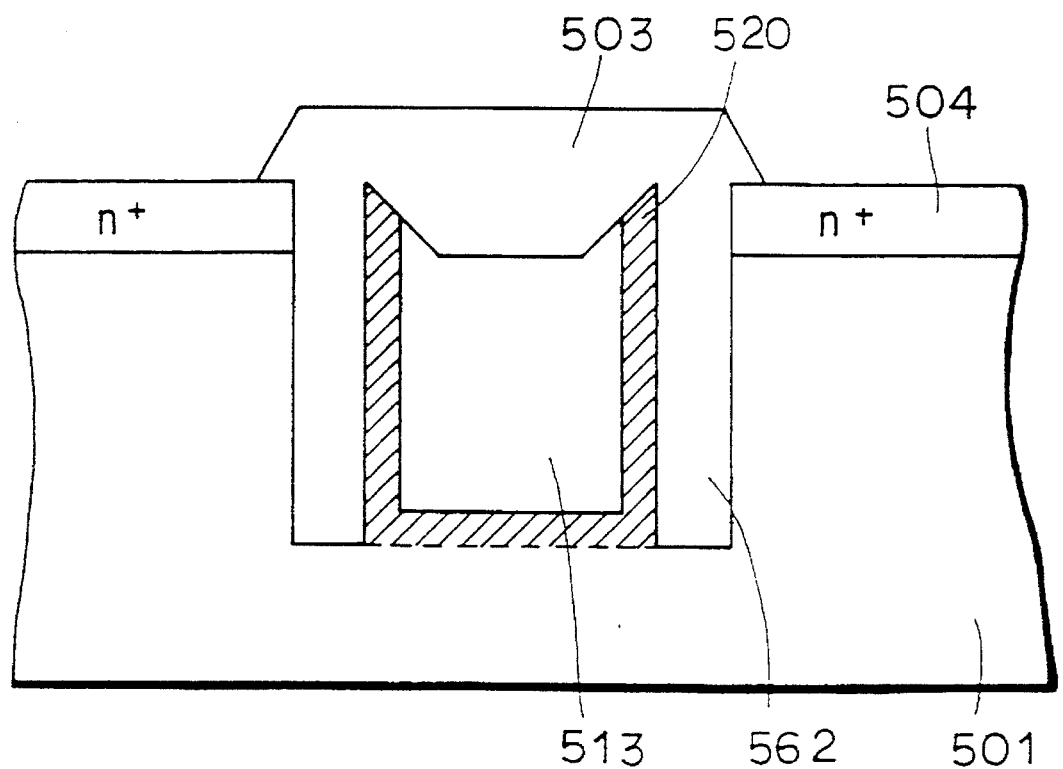
FIG. 60 is a cross section showing another structure of the semiconductor device in accordance with the third embodiment of the present invention.

In the step of FIG. 59, by controlling the process time for forming the upper insulating film 3, the thickness of the upper insulating film 503 can be made thick as shown in FIG. 60, and therefore it is also possible to locate the lower surface of the upper insulating film 3 below the main surface of the semiconductor substrate 1. By the structure shown in FIG. 60, even if the gate electrode is arranged on the upper insulating film, the parasitic capacitance can be further reduced since the gate electrode is sufficiently distant from the buried layer 510. In addition, since the upper insulating film is thick, even if the upper insulating film is etched to some extent in the succeeding process steps, possibility of short circuit between the buried layer 510 and the upper interconnections, caused by possible exposure of the buried layer 510, can be prevented.

The same effects as the second embodiments can be obtained by the third embodiment.

A fourth embodiment of the present invention will be described.

Figure 61:
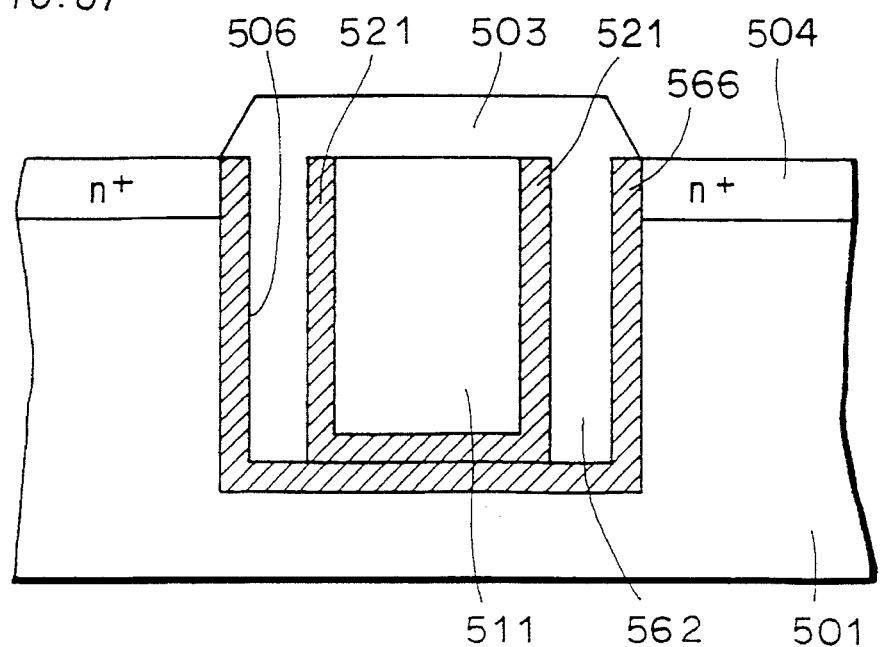
FIG. 61 is a cross section showing a structure of a semiconductor device in accordance with a fourth embodiment of the present invention.

The element isolating structure in this embodiment will be described with reference to FIG. 61. The element isolating structure of the fourth embodiment differs from the third embodiment above in the following points.

Different from the third embodiment, a high concentration impurity layer 566 is formed on the bottom surface of and on the side surfaces on the side of the semiconductor substrate 501 of the trench 506. This layer is formed to prevent a so called inverse narrow effect generated in a semiconductor element such as a MOS transistor, formed in the element isolating region when space between adjacent element isolating regions become narrow as the semiconductor device is miniaturized.

The inverse narrow effect refers to a phenomenon such as shown in FIG. 38, in which electric field E from the gate electrode 530 on the upper insulating film 503 goes to the side of the active region to invert the side surface with low impurity concentration at a low threshold voltage. The inverted layer having low threshold exists in any transistor having an arbitrary channel width. Especially in a transistor having small channel width, the ratio occupied by the side surface becomes large, lowering threshold value of the transistor. This phenomenon, in which threshold becomes lower as the channel width becomes narrower is called the inverse narrow effect.

The manufacturing steps of the element isolating structure of the fourth embodiment will be described with reference to FIGS. 62 to 69. FIGS. 62 to 69 are cross sections in accordance with the cross sectional structure of FIG. 61.

Figure 62:
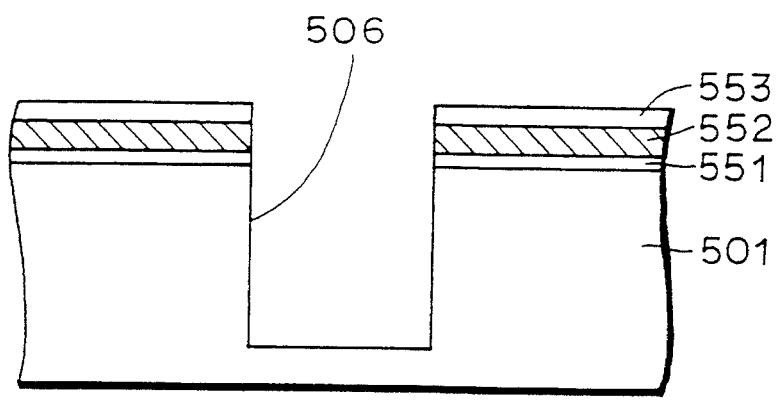
FIGS. 62 to 69 are cross sections showing the first to eighth steps of manufacturing in accordance with the first embodiment of the present invention.
Figure 63:
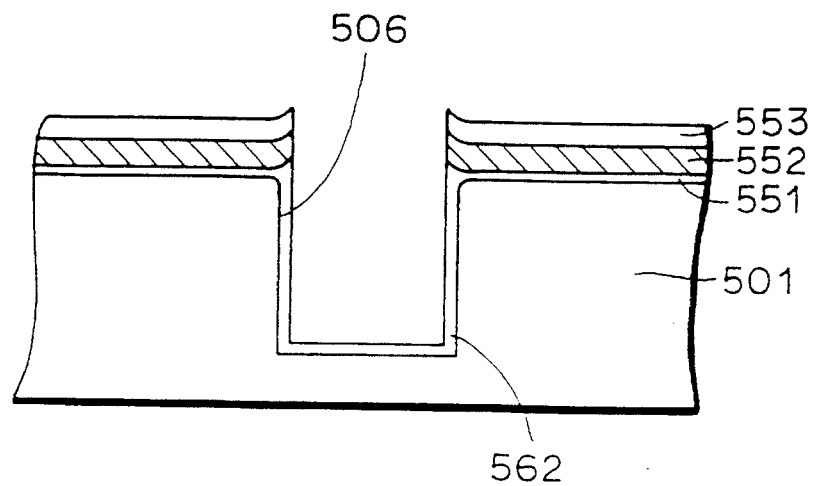

First, referring to FIG. 62, a first oxide film 511 of $SiO_2$ or the like is formed to the thickness of about 300Å by thermal oxidation on the surface of the semiconductor substrate 501. Thereafter, a silicon nitride film is formed to the thickness of 2000Å by the CVD method on the first oxide film 2. Thereafter, a second oxide film 553 of $SiO_2$ or the like is again formed to about 2000Å on the silicon nitride film 552. Thereafter, a resist film having a prescribed pattern (not shown) is formed on the surface of the second oxide film 553. Then, a trench 506 having the depth of about 0.3 to 1.0μ is formed by anisotropic etching, using the resist film as a mask.

Then, an oxide film 562 is formed by thermal oxidation entirely over the surface of the substrate. Thereafter, referring to FIG. 54, the oxide film 562 formed at the bottom of the trench 506 only is removed by an isotropic etching.

Figure 64:
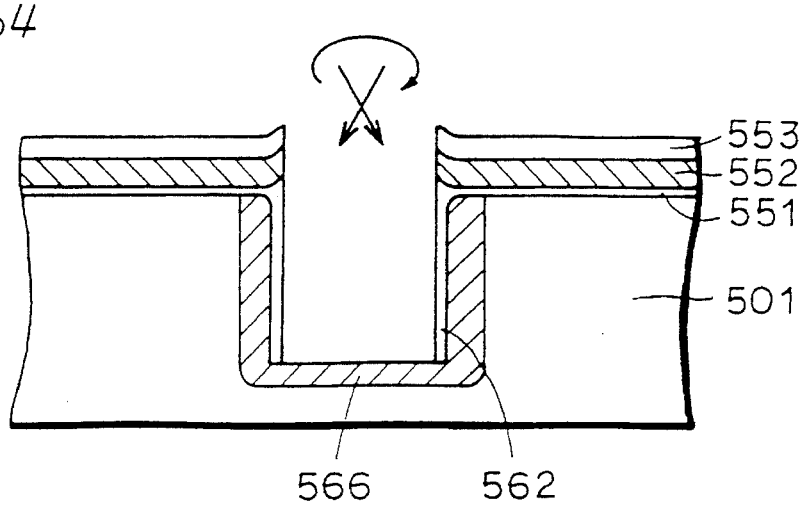

Thereafter, as shown in FIG. 64, impurities are introduced to the sidewalls and at the bottom surface of the trench 506 with the dosage of the $1 \times 10^{13}$ cm$^{-2}$ and at the energy of 50 KeV by oblique rotary ion implantation, to form a high concentration impurity layer 566 having the impurity concentration of $1 \times 10^{18}$ cm$^{-3}$.

Figure 65:
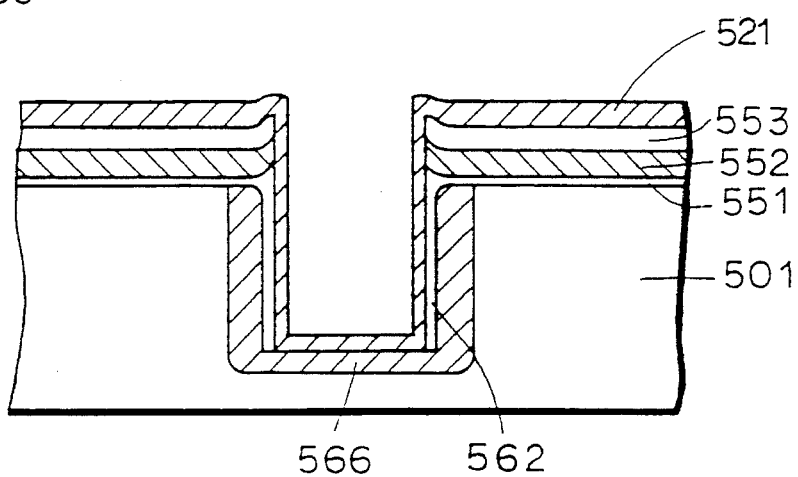

And, referring to FIG. 65, a high concentration polysilicon layer 521 having the impurity concentration of $1 \times 10^{18}$ cm$^{-3}$ or higher is formed to the thickness of 200 to 3000Å by the CVD method on the entire surface of the substrate.

Figure 66:
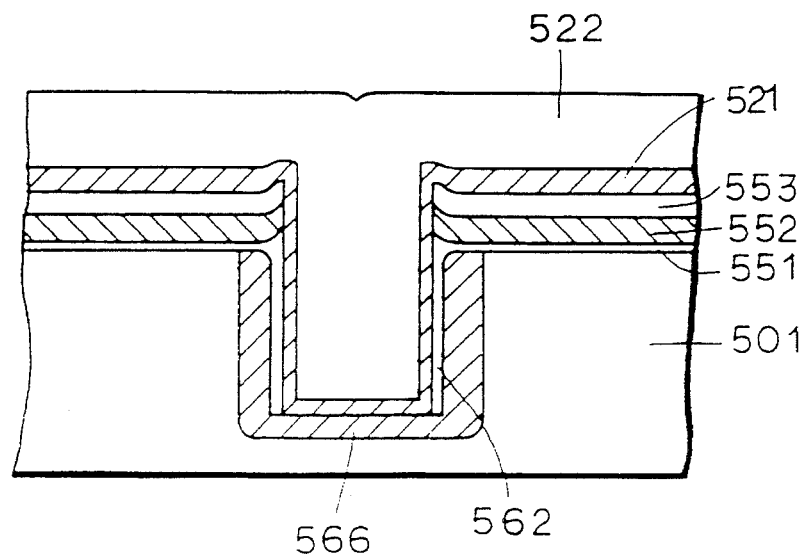
Figure 67:
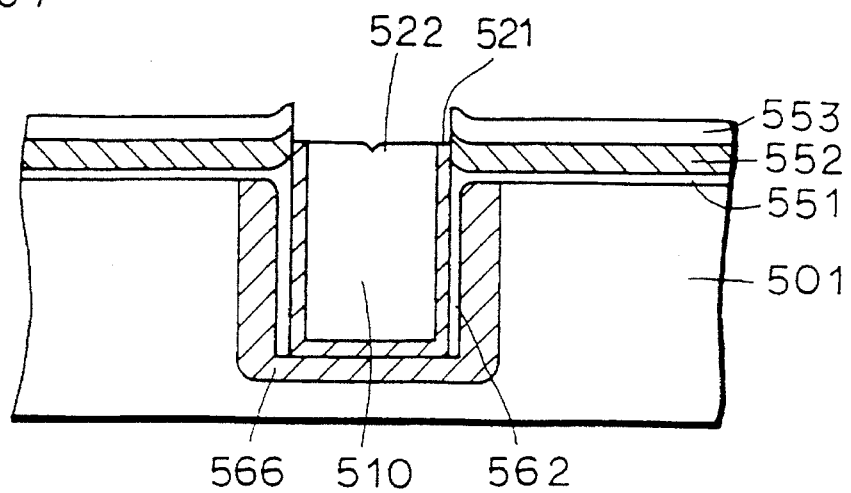
Figure 68:
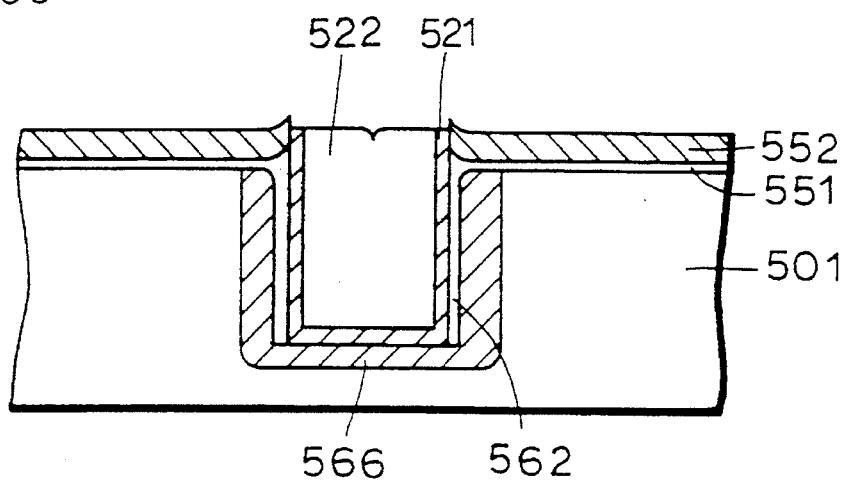

Then, referring to FIG. 66, a polysilicon layer 522 not doped with impurities is deposited on the entire surface of the substrate. Then, referring to FIG. 67, the polysilicon layer 522 is etched back to form a buried layer 510 in the trench 506.

Then, the second oxide film 552 is removed by wet etching.

Figure 69:
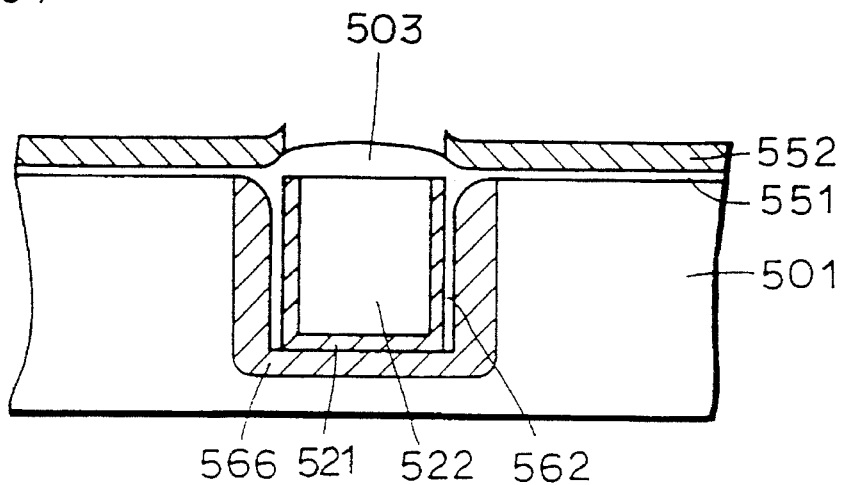
Figure 70:
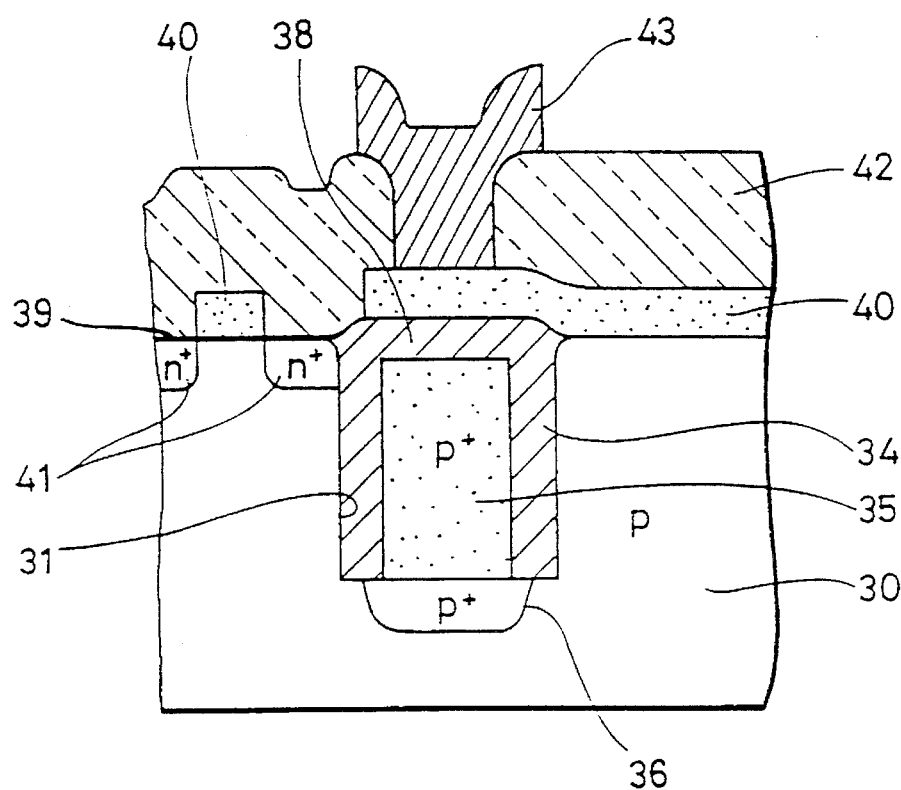
FIG. 70 is a cross section of a conventional semiconductor device.
Figure 71:
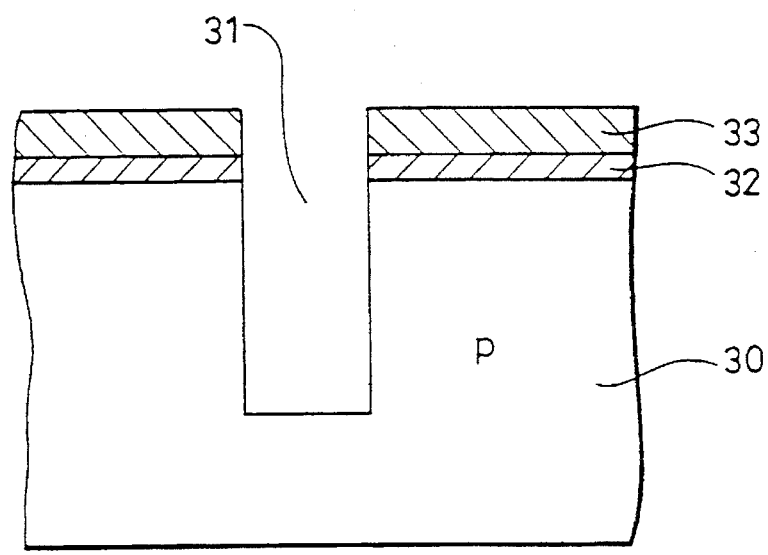
FIGS. 71 to 75 are cross sections showing the first to fifth steeps of manufacturing the conventional semiconductor device.
Figure 72:
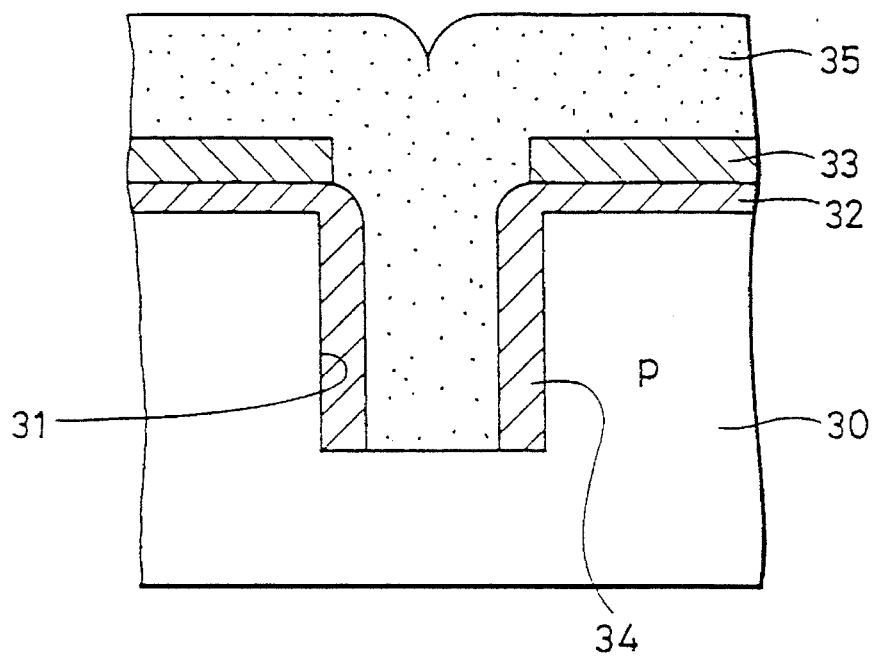
Figure 73:
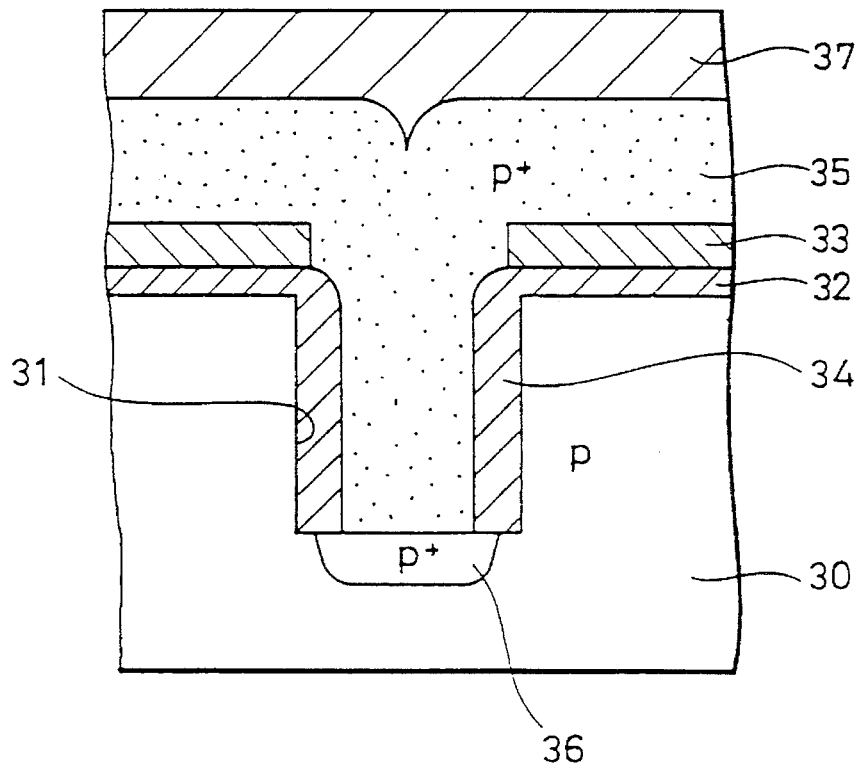
Figure 74:
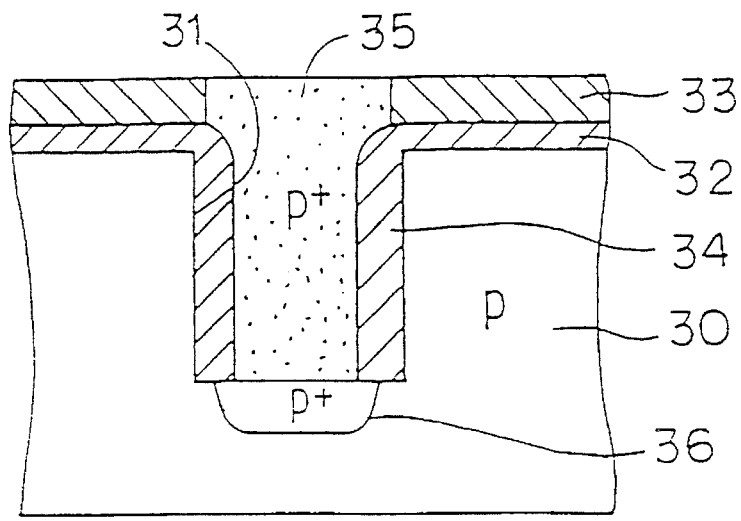
Figure 75:
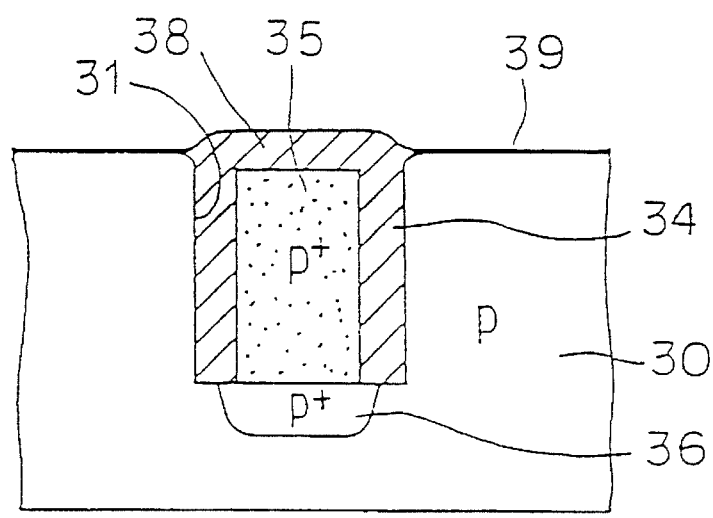
Figure 76:
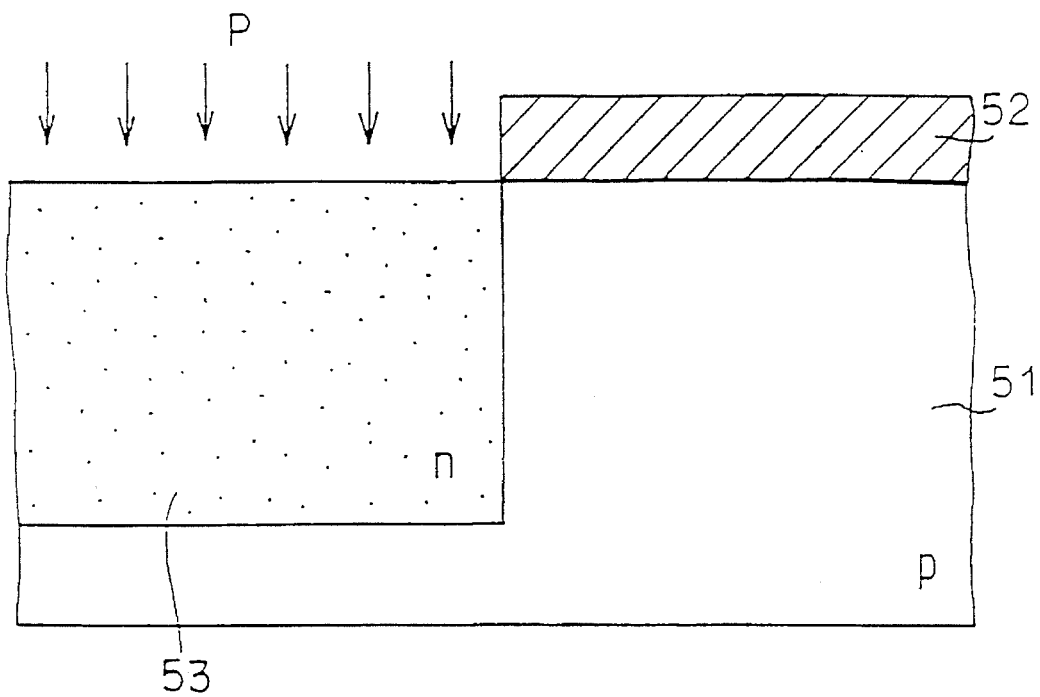
FIGS. 76 to 87 show the first to twelfth steps of manufacturing a conventional CMOS transistor.
Figure 77:
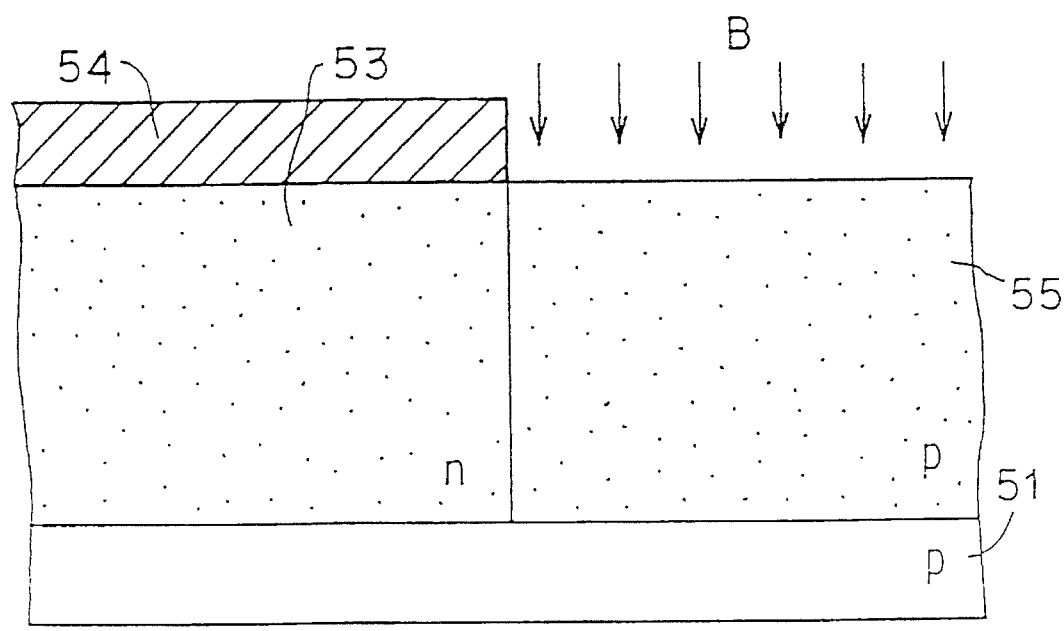
Figure 78:
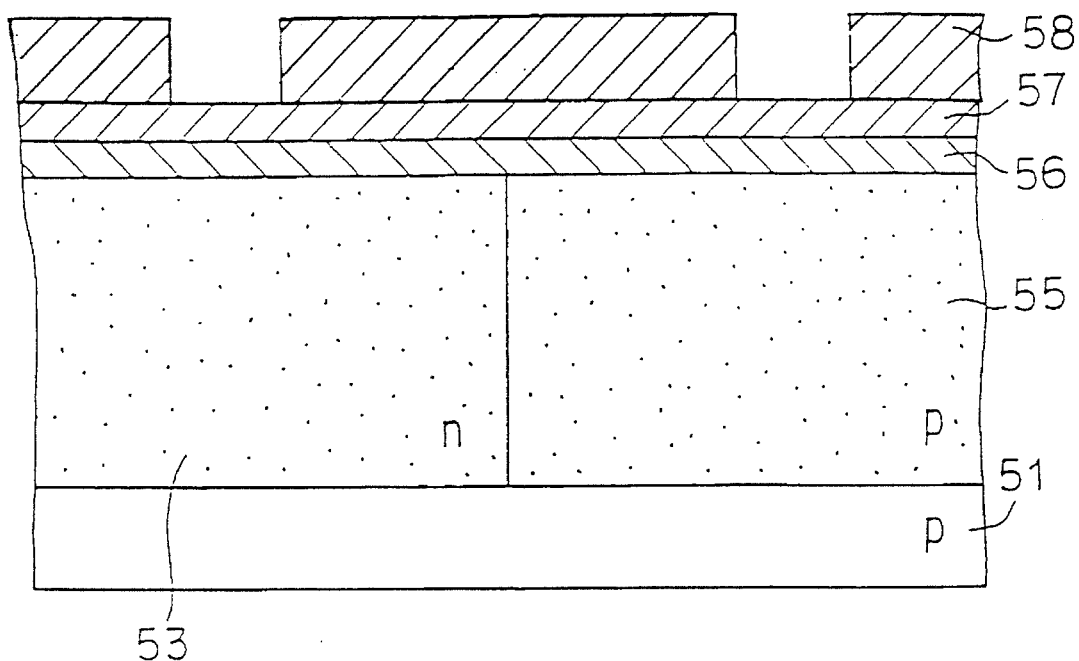
Figure 79:
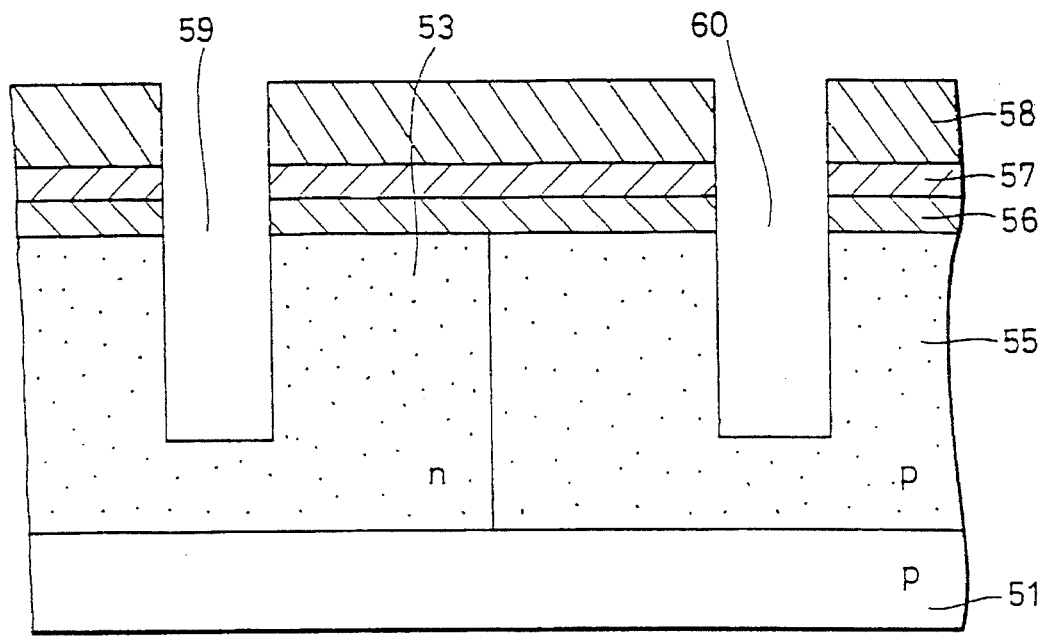
Figure 80:
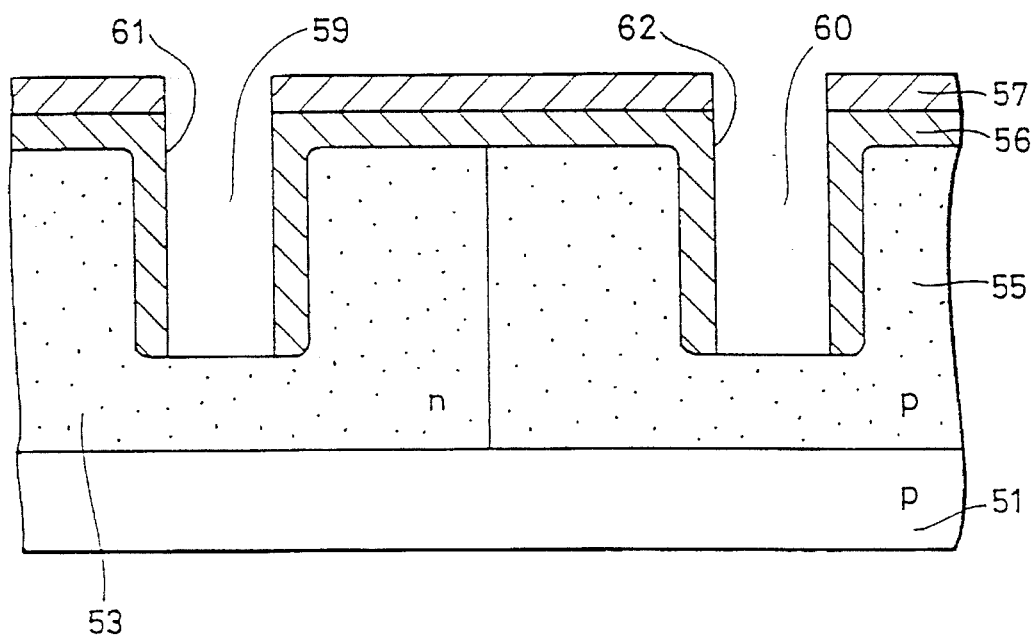
Figure 81:
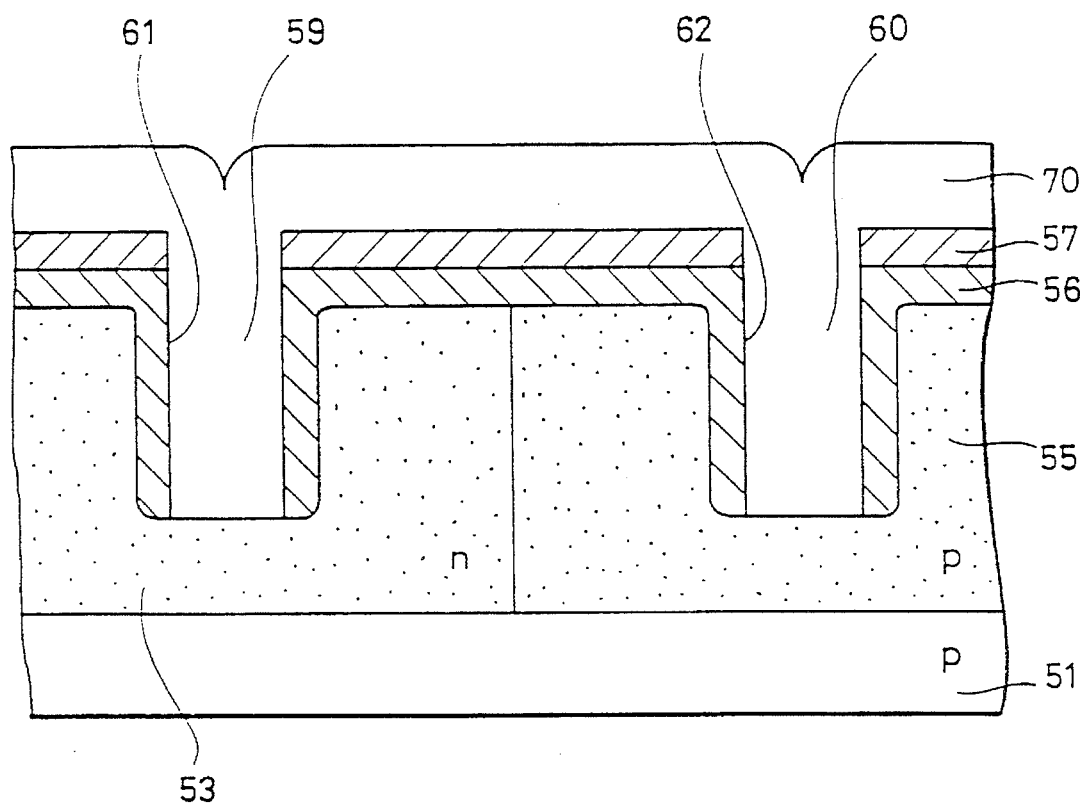
Figure 82:
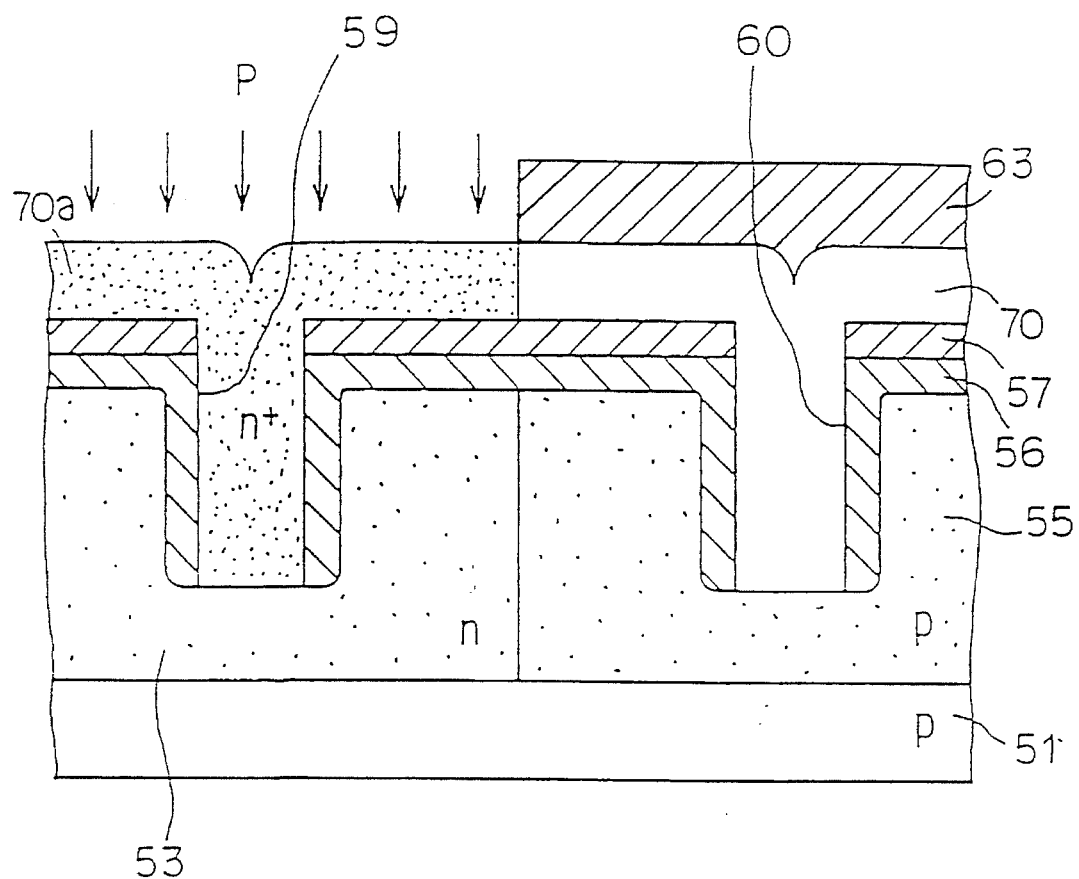
Figure 83:
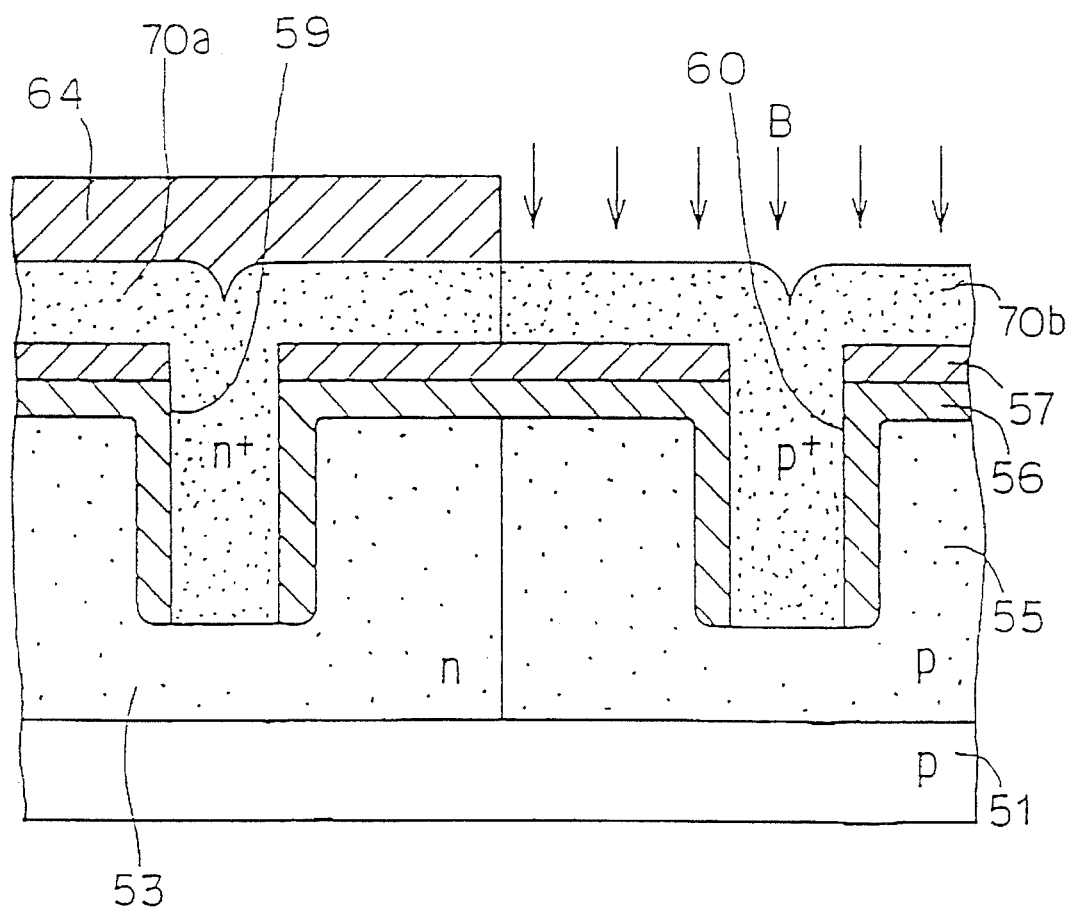
Figure 84:
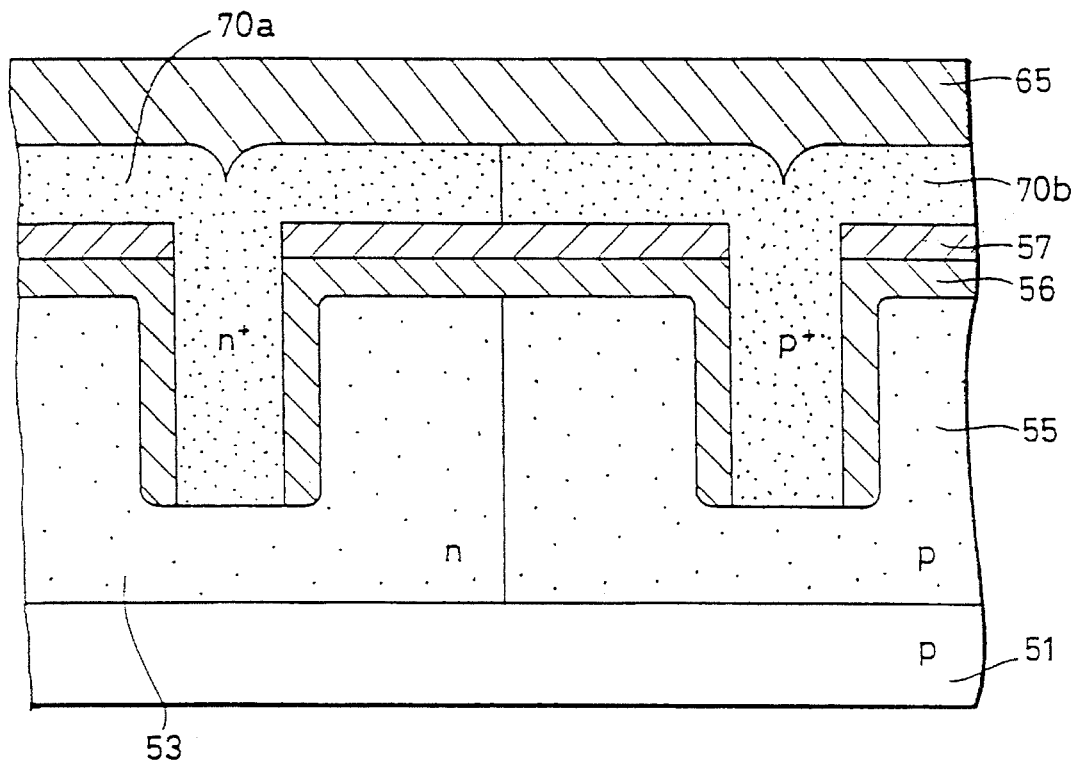
Figure 85:
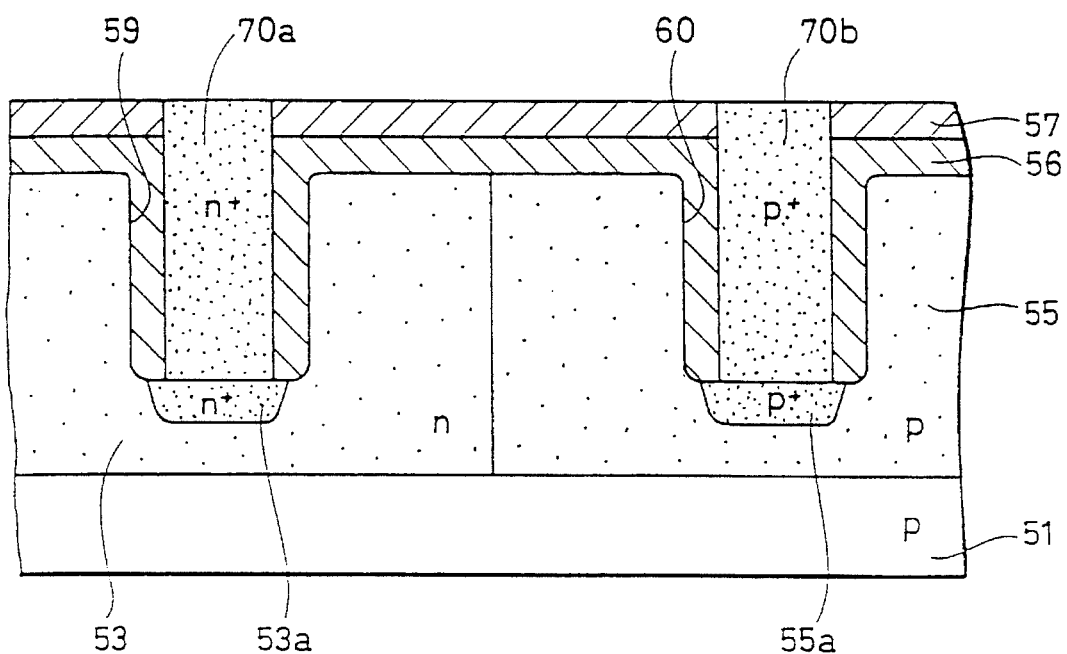
Figure 86:
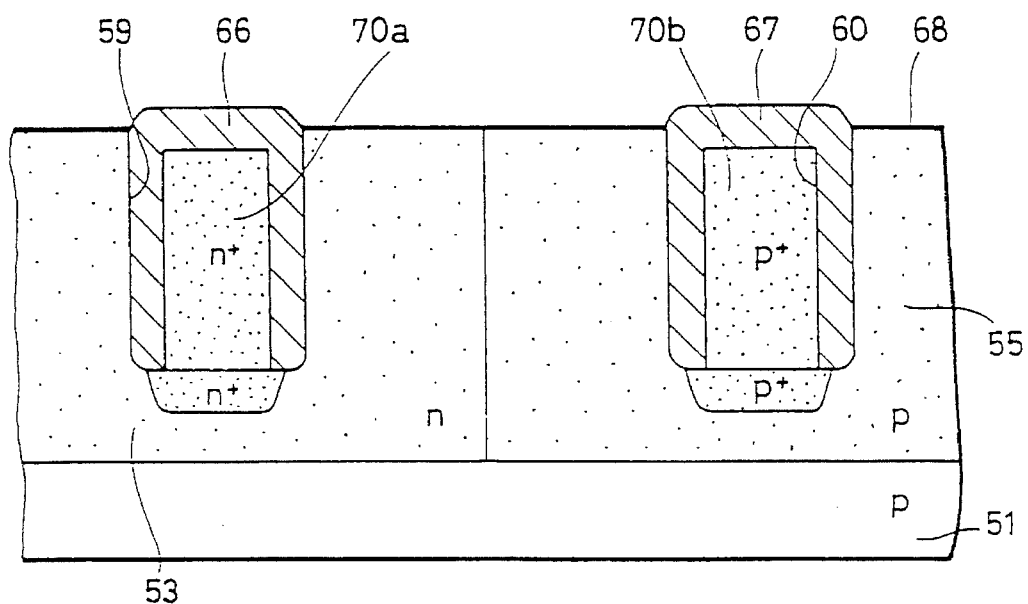
Figure 87:
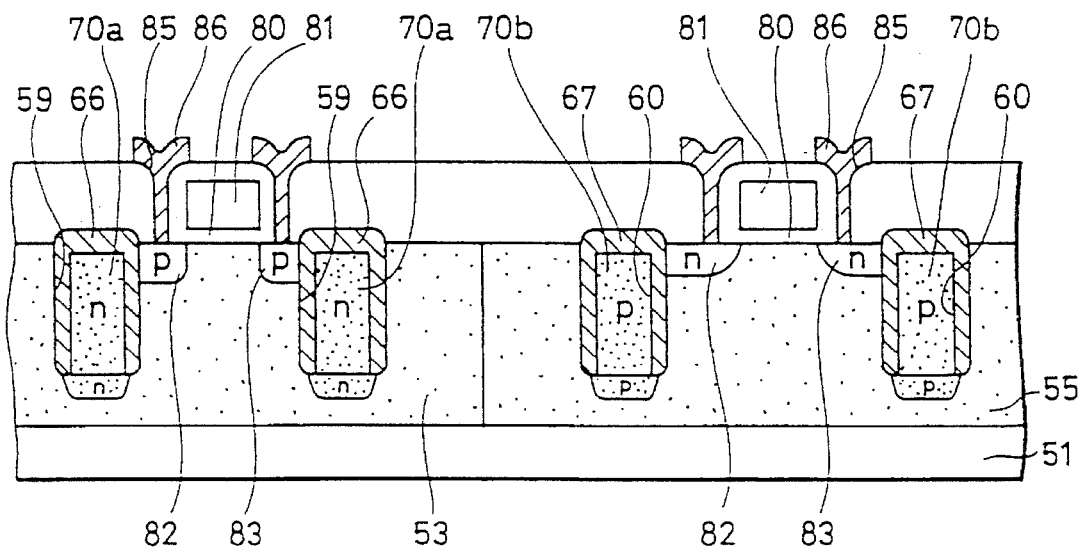
Figure 88:
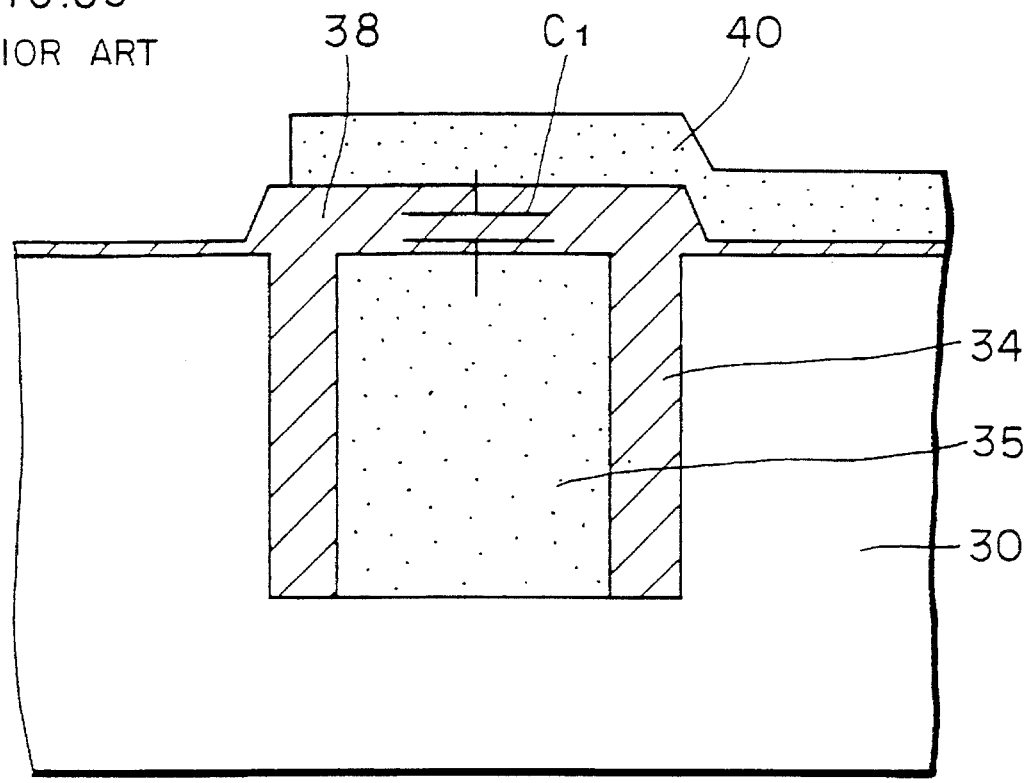
FIG. 88 is a cross section of a conventional semiconductor device.
Figure 89:
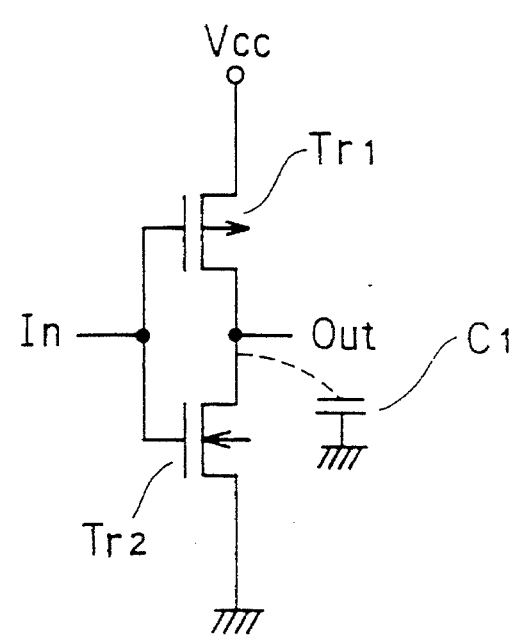
FIG. 89 is an equivalent circuit diagram showing problems of a conventional element isolating structure.
Figure 90:
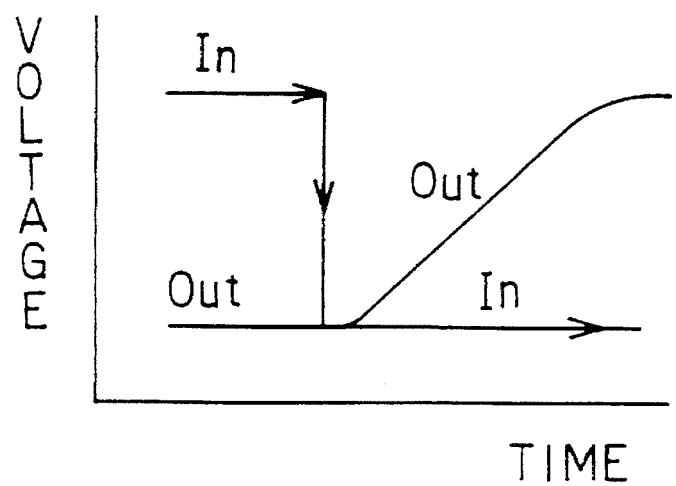
FIG. 90 shows relation between time and voltage in the conventional structure.
Figure 91:
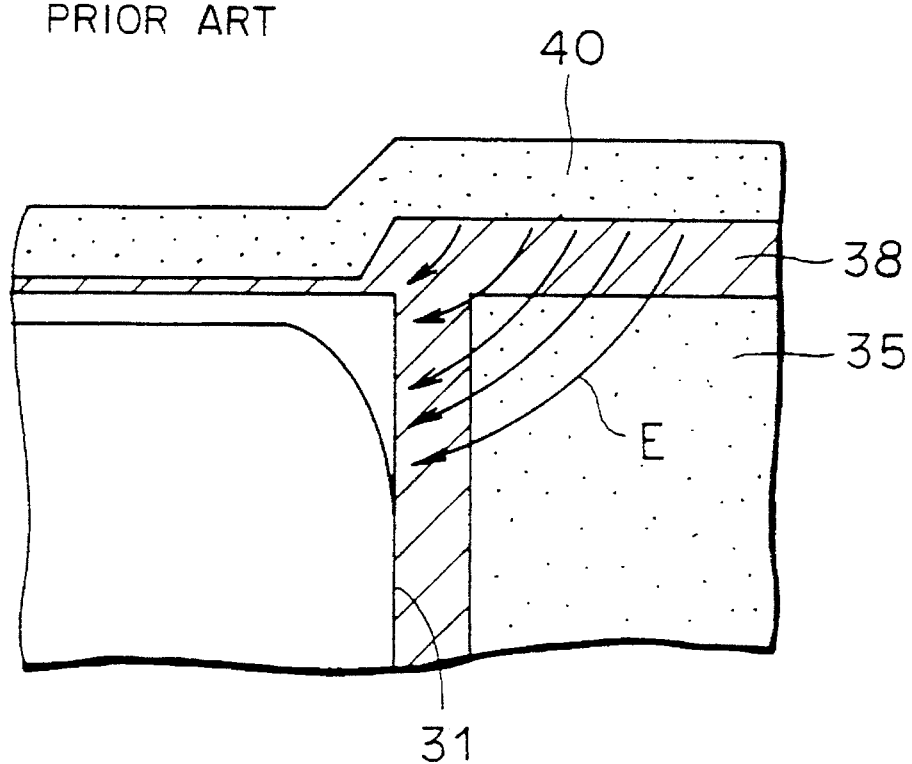
FIG. 91 is a first schematic diagram showing a problem of the element isolating structure of the prior art.
Figure 92:
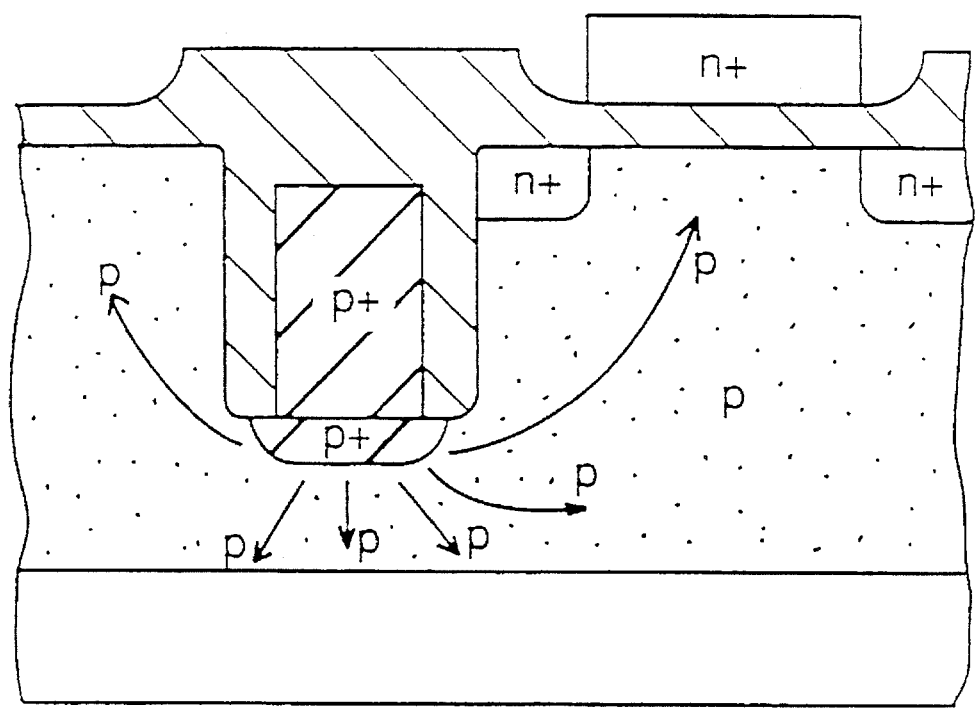
FIG. 92 is a schematic diagram showing impurity diffusion during thermal processing in the conventional semiconductor device structure.
Figure 93A:
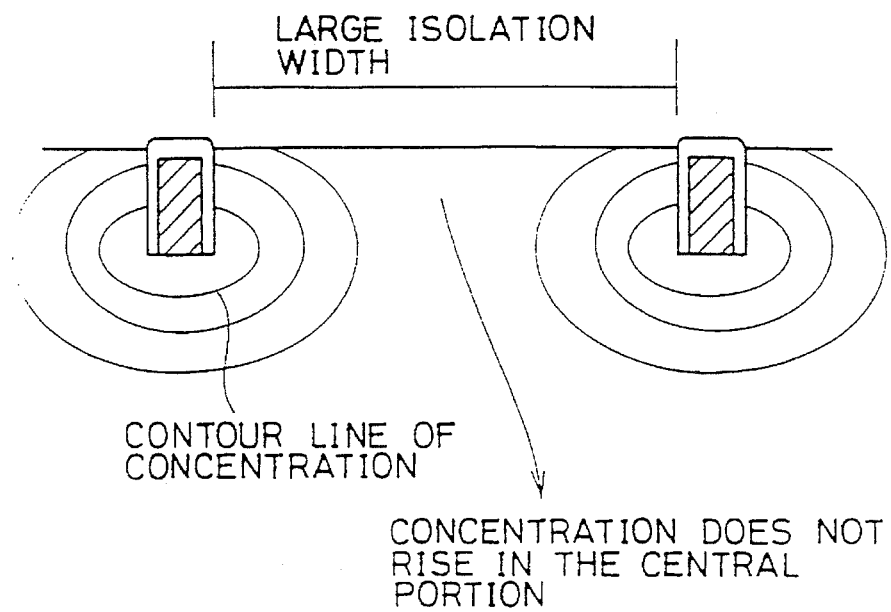
FIG. 93(a) is a schematic diagram showing impurity diffusion when the channel is wide in the structure of a conventional semiconductor device and FIG. 93(b) is a schematic diagram showing increase of concentration because of overlapped impurities when the channel is narrow in the structure of the conventional semiconductor device.
Figure 93B:
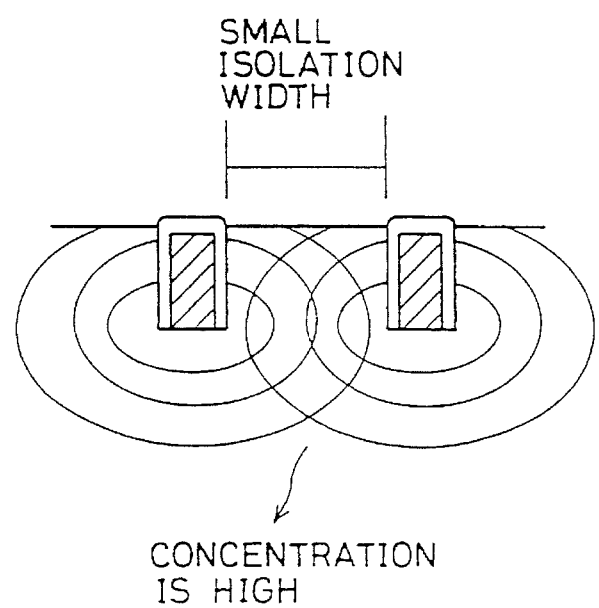

Then, referring to FIG. 69, an upper insulating film 503 is formed by using the silicon nitride film 553 as a mask by a similar method as the common LOCOS method, by thermal oxidation. Thereafter, the silicon nitride film 553 is removed by wet etching using phosphoric acid, and thus the element isolating structure shown in FIG. 61 is completed.

In the fourth embodiment described above, the same effect as the second embodiment can be provided. In addition, the inverse narrow effect can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for element isolation, comprising:

a semiconductor substrate having a main surface, said substrate comprising an impurity region of a first conductivity type having a band of maximum impurity concentration substantially parallel to said surface and at a predetermined depth therefrom, said substrate having a smaller impurity concentration of said first conductivity type between said band and said main surface; and an isolation trench having sidewalls and a bottom extending from the main surface to said band, said trench filled with an isolation material and wherein said band extends laterally from a portion of said trench sidewalls and said bottom in contact with said band and wherein said substrate, said impurity region of said substrate, said band of maximum impurity concentration and said small impurity concentration are of the same conductivity type.

2. The semiconductor device for element isolation according to claim 1, wherein said isolation material is silicon oxide.

3. The semiconductor device for element isolation according to claim 1, wherein said isolation material has a thermal expansion coefficient similar to the thermal expansion coefficient of the substrate.

4. The semiconductor device for element isolation according to claim 1, wherein said isolation material comprises an oxide film.

5. The semiconductor device for element isolation according to claim 1, wherein said maximum impurity concentration is of a value of at least $1\times10^{16}$ ions/cm$^3$.

6. The semiconductor device for element isolation according to claim 3, wherein said substrate is a silicon substrate and said isolation material comprises polysilicon in contact with said substrate at said band.

7. The semiconductor device for element isolation according to claim 3, wherein said substrate is a silicon substrate and said isolation material comprises single crystal silicon in contact with said substrate at said band.

8. The semiconductor device for element isolation according to claim 6, wherein said trench further comprises an oxide film extending between each of said sidewalls and said polysilicon and covering an upper surface of said polysilicon.

9. The semiconductor device for element isolation according to claim 6, wherein said polysilicon contains impurities of said first conductivity type.

10. The semiconductor device for element isolation according to claim 7, wherein said trench further comprises an oxide film extending between each of said sidewalls and said single crystal silicon and covering an upper surface of said single crystal silicon.

11. The semiconductor device for element isolation according to claim 7, wherein said single crystal silicon contains impurities of said first conductivity type.

12. A semiconductor device for element isolation, comprising:

a semiconductor substrate having an impurity region of a first conductivity type having impurity concentration reaching a maximum value at a predetermined depth from a surface in the depth direction;

a trench formed to a predetermined depth from the surface of said semiconductor substrate in said impurity region of a first conductivity type wherein said impurity concentration of maximum value extends laterally in a band from a bottom of said trench;

an impurity diffusion region of said first conductivity type provided with a space from an internal sidewall of the trench in said trench, having only its bottom portion connected to said impurity region of the first conductivity type of said semiconductor substrate and having almost the same impurity concentration as said impurity region of the first conductivity type; and an oxide film filling the space between the internal sidewall of said trench and said impurity diffusion region, and covering an upper surface of said impurity diffusion region and a surface of said semiconductor substrate; wherein said substrate, said impurity region of said semiconductor substrate, said impurity concentration of maximum valve and said impurity diffusion region are of the same conductivity type.

13. The semiconductor device for element isolation according to claim 12, wherein the maximum value of an impurity concentration in said impurity region of the first conductivity type is $1\times10^{16}$ ions/cm$^3$.

14. A semiconductor device, comprising: a semiconductor substrate of a first conductivity type having a main surface;

a trench formed at a prescribed depth from said main surface;

a pair of sidewall insulating films extending along sidewalls of said trench to said prescribed depth;

a buried layer having a prescribed impurity concentration of said first conductivity type, buried in said trench surrounded by said pair of sidewall insulating films;

an upper insulating film formed to substantially cover the trench at said main surface; and a pair of conductive layers of said first conductivity type and having higher impurity concentration than said buried layer which are in contact with a lower surface of said upper insulating film and with inner surfaces of sidewall insulating films in the region of said buried layer and provided near a side portion of said buried layer, said pair of conductive layers extending in said trench at a depth less than said prescribed depth and being the only region of higher impurity concentration of the first conductivity type in said trench.

15. The semiconductor device for element isolation according to claim 14, wherein said pair of conductive layers include a bottom conductive layer having a prescribed impurity concentration for coupling the respective conductive layers.

16. The semiconductor device for element isolation according to claim 15, wherein said pair of conductive layers and said bottom conductive layer have the same impurity concentration.

17. The semiconductor device for element isolation according to claim 15, comprising:

an external conductive layer having a prescribed impurity concentration formed to be in contact with an outer side of said pair of internal insulating films from the surface of said semiconductor substrate, and to cover the pair of internal insulating films and said bottom conductive layer.

18. The semiconductor device for element isolation according to claim 17, wherein said pair of conductive layers, said bottom conductive layer and said external conductive layer have the same impurity concentration.

19. The semiconductor device for element isolation according to claim 14, wherein a part of the lower surface of said upper insulating film is positioned lower than the position of the main surface of said semiconductor substrate.

* * * * *